United States Patent
Nebashi et al.

(10) Patent No.: US 9,135,988 B2
(45) Date of Patent: Sep. 15, 2015

(54) SEMICONDUCTOR DEVICE AND CONTROL METHOD OF THE SAME

(75) Inventors: Ryusuke Nebashi, Tokyo (JP); Noboru Sakimura, Tokyo (JP); Yukihide Tsuji, Tokyo (JP); Ayuka Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 40 days.

(21) Appl. No.: 14/343,325

(22) PCT Filed: Sep. 7, 2012

(86) PCT No.: PCT/JP2012/072874
§ 371 (c)(1),
(2), (4) Date: Mar. 6, 2014

(87) PCT Pub. No.: WO2013/035836
PCT Pub. Date: Mar. 14, 2013

(65) Prior Publication Data
US 2014/0233304 A1    Aug. 21, 2014

(30) Foreign Application Priority Data
Sep. 9, 2011  (JP) .................................. 2011-197517

(51) Int. Cl.
G11C 11/00 (2006.01)
G11C 11/419 (2006.01)
G06F 9/30 (2006.01)
G11C 14/00 (2006.01)
H03K 17/24 (2006.01)
G06F 9/44 (2006.01)

(52) U.S. Cl.
CPC .......... *G11C 11/419* (2013.01); *G06F 9/30098* (2013.01); *G06F 9/30101* (2013.01); *G11C 14/0081* (2013.01); *G06F 9/4418* (2013.01); *G11C 2207/007* (2013.01); *H03K 17/24* (2013.01)

(58) Field of Classification Search
USPC ................................ 365/154, 189.15, 189.16
See application file for complete search history.

(56) References Cited

U.S. PATENT DOCUMENTS

| 6,914,845 | B2 | 7/2005 | Ooishi |
| 6,999,342 | B2 | 2/2006 | Ooishi |
| 7,237,156 | B1 * | 6/2007 | Srinivasan et al. ............. 714/719 |
| 7,319,602 | B1 * | 1/2008 | Srinivasan et al. ........... 365/49.1 |

(Continued)

FOREIGN PATENT DOCUMENTS

| JP | 53-121435 | 10/1978 |
| JP | 2002-182803 | 6/2002 |

(Continued)

OTHER PUBLICATIONS

International Search Report, PCT/JP2012/072874, Oct. 16, 2012.

*Primary Examiner* — Vu Le
(74) *Attorney, Agent, or Firm* — Young & Thompson

(57) ABSTRACT

A semiconductor device includes non-volatile registers, each including a holding circuit to hold data in a volatile manner and a non-volatile element. An address is allocated to each of the non-volatile registers. A non-volatile register control circuit performs control such that, in response to a write instruction, data held in the holding circuit is written to the non-volatile element in the non-volatile register having the address specified by the instruction and in response to a load instruction, data held in the non-volatile element is held in the holding circuit in the non-volatile register having the address specified by the instruction.

15 Claims, 17 Drawing Sheets

(56) References Cited

U.S. PATENT DOCUMENTS

| | | |
|---|---|---|
| 8,243,502 B2 | 8/2012 | Sakimura et al. |
| 8,295,079 B2 | 10/2012 | Yamamoto et al. |
| 2004/0066669 A1 | 4/2004 | Ooishi |
| 2004/0141363 A1 | 7/2004 | Ohtsuka et al. |
| 2005/0195664 A1 | 9/2005 | Ooishi |
| 2010/0265760 A1 | 10/2010 | Sakimura et al. |
| 2010/0271866 A1 | 10/2010 | Sakimura et al. |
| 2011/0273925 A1 | 11/2011 | Yamamoto et al. |

FOREIGN PATENT DOCUMENTS

| | | |
|---|---|---|
| JP | 2004-133969 | 4/2004 |
| WO | WO 03/085741 | 10/2003 |
| WO | WO 2009/028298 | 3/2009 |
| WO | WO 2009/072511 | 6/2009 |
| WO | WO 2009/078242 | 6/2009 |

\* cited by examiner

SEMICONDUCTOR DEVICE AND CONTROL METHOD OF THE SAME

TECHNICAL FIELD

Reference to Related Application

This application is based upon and claims the benefit of the priority of Japanese Patent Application No. 2011-197517 filed on Sep. 9, 2011, the disclosure of which is incorporated herein in its entirety by reference thereto.

The present invention relates to a semiconductor device and a control method of the semiconductor device. More specifically, the invention relates to a semiconductor device including storage means such as a nonvolatile register and a control method of the semiconductor device.

BACKGROUND

With an improvement of an integration degree of a semiconductor device in recent years, an increase in power dissipation due to a leakage current of a transistor when a circuit is not in operation has become a problem. There has been developed a semiconductor integrated circuit including a low power dissipation mode in which when the semiconductor integrated circuit is not used, power supply to the circuit (circuit block) or power supply to the entire LSI (Large Scale Integrated Circuit) is stopped to reduce a leakage current.

However, in a volatile memory such as a flip-flop, a latch, or a dynamic memory configured to store data in a capacitance thereof, stored information is lost when power is off. That is, when power supply to a semiconductor integrated circuit including the volatile memory is stopped, an internal state (stored information) of the semiconductor integrated circuit, except a nonvolatile memory, is erased. For that reason, in a semiconductor integrated circuit, it is necessary to save, in an external storage (such as a non-volatile storage equipment) or the like, data desired to be retained before the stop of the power supply.

Patent Literature 1 discloses a method and an apparatus configured to save a state of a computer system component. Patent Literature 1 discloses a configuration for providing a resume function of a battery-powered computer system after an integrated circuit in the computer system has been completely shut off. In this configuration, an internal state of the computer system is read by using a scanning latch provided in the computer system component, the internal state that has been read is stored in a save region, and then power is shut off.

In an arrangement in which a memory element is disposed separately from a circuit portion holding an internal state, as disclosed in Patent Literature 1, a time delay and power dissipation due to data transfer occur. Especially, in the case where power on/off is performed highly frequently, the time delay and the power dissipation due to the data transfer may increase.

Patent Literature 2 discloses a semiconductor device configured to be able to transition at high speed into a standby mode where power dissipation is reduced, while internal information is being held. In Patent Literature 2, before a power-off of a relevant circuit block to be brought into a standby state, or before a power-off of an entire chip, a power supply control unit activates a control signal supplied to the circuit block to cause the circuit block to save an operation result processed by the circuit block in a memory unit. When a power supply is provided again to the circuit block that has been brought into the standby state, the power supply control unit activates a control signal after start of the power supply to cause the circuit block to restore thereto the data saved in the memory unit. Flip-flops in the circuit block are configured to be connected in series, when data is saved or restored, to perform data transfer in a path different from that when a normal operation is performed. In the semiconductor device described in Patent Literature 2, there are added non-volatile memory to eliminate the need for performing a complex transfer operation, thereby making it possible to save data at high speed.

The semiconductor device described in Patent Document 2, however, has a problem that unnecessary writing and loading occurs, so that power dissipation increases. The problem arises because, each time a power supply switch provided in each module is turned on and off, data held in all volatile latches included in the module are saved to and restored from a non-volatile memory portion. The unnecessary writing and loading therefore occurs. Especially, in the case where a magnetic element is employed as a non-volatile memory, for example, a write current necessary for rewriting data is typically several 100 µA to several mA per bit, which is large. For this reason, when all non-volatile memories are rewritten for each power-off, power dissipation needed for the rewriting will increase. Further, in the computer system disclosed in each of Patent Literatures 1 and 2, it may happen that a time for saving an internal state cannot be ensured when there occurs an unexpected power supply stop due to a failure or the like.

Patent Literature 3 discloses a configuration including a non-volatile latch circuit. The non-volatile latch circuit includes a latch circuit and first and second magnetoresistive elements. When writing is performed, a current supply unit complementarily changes magnetization states of the first and second magnetoresistive elements according to a state of the latch circuit. When reading is performed, data corresponding to magnetization states of the first and second magnetoresistive elements (e.g. MTJ (Magnetic Tunnel Junction) elements) is set as data to be held by the latch circuit. Patent Literature 4 discloses a memory circuit including a bistable circuit configured to store data and ferromagnetic tunnel junction elements (MTJ1, MTJ2), each configured to store data stored in the bistable circuit according to the magnetization direction of a ferromagnetic electrode free layer in a nonvolatile manner. The memory circuit can restore the data stored in the ferromagnetic tunnel junction elements (MTJ1, MTJ2) in the nonvolatile manner to the bistable circuit.

CITATION LIST

Patent Literature

Patent Literature 1:
JP Patent Kokai Publication No. JP2002-182803A
Patent Literature 2:
JP Patent Kokai Publication No. JP2004-133969A
Patent Literature 3:
International Publication No. WO2009/078242
Patent Literature 4:
International Publication No. WO2009/028298

SUMMARY

Each disclosure of the above-listed Patent Literatures 1 to 4 is incorporated herein by reference. The following analysis is given by the present invention. In the semiconductor device (semiconductor integrated circuit) in each related art, a delay in data transfer and an increase in a power dissipated in an interconnect and a circuit for transferring data, caused by separate arrangement of a memory element and a logic element have become a problem.

Accordingly, it is an object of the present invention to provide a semiconductor device and a control method thereof enabling reduction in time and power dissipation required for data saving and restoration.

Another object of the present invention is to provide a semiconductor device and a control method thereof enabling reduction in the number of times of rewriting a non-volatile memory and the number of times of loading from the non-volatile memory, and reduction in the number of non-volatile elements configured to perform rewriting and loading, in addition to achievement of the above-mentioned object.

A further object of the present invention is to provide a semiconductor device and a control method thereof enabling to enhance resistance to power failure or the like.

According to the present invention, there is provided a semiconductor device comprising:

a semiconductor device comprising:

an instruction decoder configured to decode an instruction read from a storage equipment;

one or a plurality of non-volatile registers, each non-volatile register having an address allocated, said each non-volatile register including at least one flip-flop, said flip-flop including:

a holding circuit configured to hold data in a volatile manner; and a non-volatile element configured to hold data in a non-volatile manner; and a non-volatile register control circuit configured to control said one or plurality of non-volatile registers, wherein an instruction set comprises:

a write instruction including information specifying an address of said non-volatile register and information specifying writing of data from said holding circuit to said non-volatile element in said non-volatile register; and a load instruction including information specifying an address of said non-volatile register and information specifying loading from said non-volatile element to said holding circuit in said non-volatile register, said non-volatile register control circuit performing control such that, when an instruction decoded by said instruction decoder is said write instruction, data held in said holding circuit is transferred and written to said non-volatile element in said non-volatile register having an address specified by said write instruction, while, when said instruction decoded by said instruction decoder is said load instruction, data held in said non-volatile element is transferred to and held in said holding circuit in said non-volatile register having an address specified by said load instruction.

According to the present invention, there is provided a control method of a semiconductor device comprising:

one or a plurality of non-volatile registers each including at least one flip-flop including a holding circuit configured to hold data in a volatile manner and a non-volatile element configured to hold the data in a non-volatile manner, an address being given to each non-volatile register, the method comprising:

provided, as an instruction set:

a write instruction including information specifying the address of the non-volatile register and information specifying data writing from the holding circuit to the non-volatile element in the non-volatile register; and a load instruction including information specifying the address of the non-volatile register and information specifying loading from the non-volatile element to the holding circuit in the non-volatile register;

when an instruction decoded by an instruction decoder is the write instruction, transferring the data held in the holding circuit to be written to the non-volatile element in the non-volatile register with the address specified by the write instruction, and when the instruction decoded by the instruction decoder is the load instruction, transferring the data held in the non-volatile element to be held in the holding circuit in the non-volatile register with the address specified by the load instruction.

According to the present invention, reduction in time and power dissipation needed for data saving and restoration can be achieved. Further, according to the present invention, the number of times of rewriting a non-volatile memory and number of times of loading from the non-volatile memory can be reduced, so that the number of non-volatile elements configured to perform the rewriting and the loading can be reduced. Still further, according to the present invention, resistance to power failure or the like can be enhanced.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

Figure 1:
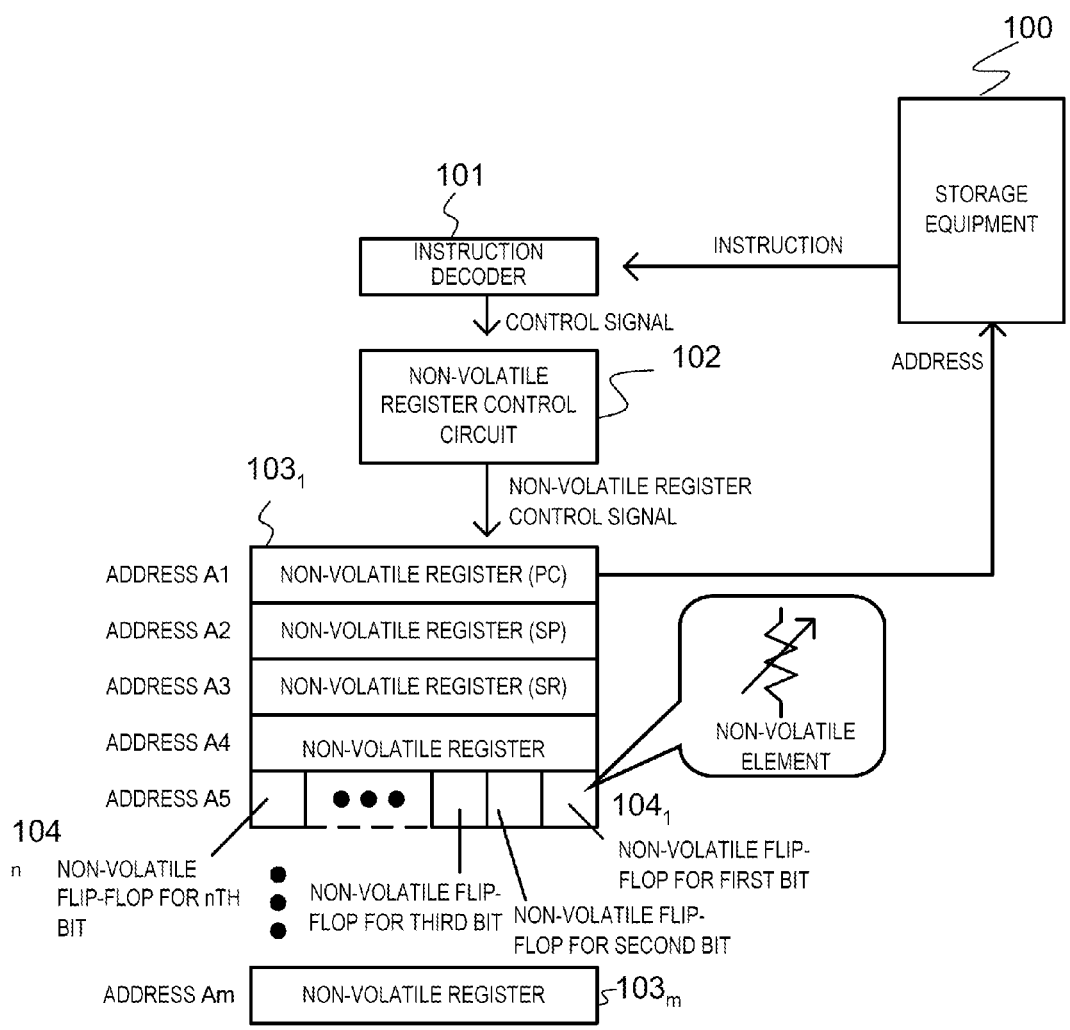
FIG. 1 is a diagram illustrating a configuration of a first exemplary embodiment of the present invention.

According to a semiconductor device in an exemplary embodiment of the present invention, there are provided m non-volatile registers ($103$: $103_1$ to $103_m$), an instruction decoder ($101$), and a non-volatile register control circuit ($102$). Addresses A1 to Am are respectively allocated to the m non-volatile registers ($103_1$ to $103_m$). Each of the non-volatile registers ($103$) includes flip-flops ($104$: $104_1$ to $104_n$), each flip-flop including a holding circuit configured to hold data in a non-volatile manner and a non-volatile element configured to hold data in a non-volatile manner.

The instruction decoder ($101$) is configured to decode an instruction read from a storage equipment ($100$) configured to hold the instruction.

The instruction includes bits (operand) for specifying an address Ax ($1 \leq x \leq m$) of one non-volatile register ($103x$), and bits (op code) for specifying writing/loading.

When an instruction decoded by the instruction decoder ($101$) is a write instruction for the non-volatile element in the non-volatile register, the non-volatile register control circuit ($102$) performs control such that the data held in the holding circuit is written to the non-volatile element in the non-volatile register ($103x$) having an address Ax specified by the instruction. When the instruction decoded by the instruction decoder ($101$) is a load instruction from the non-volatile element, the non-volatile register control circuit ($102$) performs control such that the data held in the non-volatile element is loaded to the holding circuit in the non-volatile register ($103x$) having an address Ax specified by the instruction.

According to some exemplary embodiments of the present invention, p non-volatile element write mode bits (WMB1 to WMBp) are provided in a predetermined bit field of the instruction. Alternatively, the semiconductor device may include a register ($106$) configured to hold the non-volatile element write mode bits (WMB1 to WMBp). The addresses A1 to Am of the m non-volatile registers ($103_1$ to $103_m$) are divided into q groups G1 to Gq. Each group Gy is associated with one bit WMBz of the non-volatile element write mode bits WMB1 to WMBp, or there is no non-volatile element write mode bit associated with the group Gy. Assume that writing is performed to the holding circuit in the non-volatile register ($103x$) having an address Ax belonging to the group Gy. Then, when the associated write mode bit WMBz is in an active state (a logic value 1, for example), write data for the holding circuit may be written to the non-volatile element of the non-volatile register having the specified address Ax. When the associated non-volatile element write mode bit WMBz is in an inactive state (a logic value 0, for example), the write data for the holding circuit is not written to the non-volatile element of the non-volatile register having the specified address Ax. When the associated non-volatile element write mode bit WMBz is not present, the write data for the holding circuit is not written to the non-volatile element of the non-volatile register having the specified address Ax.

According to another exemplary embodiment of the present invention, a semiconductor device may further include a register ($107$) holding r flag bits (dirty bits) DTY1 to DTYr, each indicating that contents of the holding circuit and the non-volatile element in the non-volatile register are different. The addresses A1 to Am of the m non-volatile registers are divided into s groups G1 to Gs. Each group Gy is associated with one DTYz of the dirty bits DTY1 to DTYr in a one-to-one correspondence, or there is no dirty bit associated with the group Gy.

In the case where data in the holding circuits and data held in the non-volatile elements in all of the non-volatile registers belonging to the group Gy match, when the dirty bit DTYz associated with the group Gy is present, the non-volatile register control circuit ($102$) sets the dirty bit DTYz to a first value (such as a logic 0). In the case where there is a possibility that the data held in the holding circuits and the data held in the non-volatile elements in all of the non-volatile registers belonging to the group Gy may not match, when the dirty bit DTYz is present, the non-volatile register control circuit ($102$) sets the dirty bit DTYz to a second value (such as a logic 1).

Assume that the instruction decoded by the decoder is the write instruction for the non-volatile element in the non-volatile register having an address Ax. Then, when the dirty bit DTYz associated with the group Gy to which the non-volatile register having the address Ax belongs is present, and when the dirty bit DTYz has the second value (logic 1), data held in the holding circuit is written to the non-volatile element of the non-volatile register having the address Ax. When the dirty bit DTYz has the first value (logic 0), the data held in the holding circuit is not written to the non-volatile element of the non-volatile register having the address Ax.

According to the exemplary embodiment of the present invention, setting of a preset initial value in the holding circuit in the non-volatile register having an address Ax belonging to the group Gy, may be accompanied with the power on. When the dirty bit DTYz associated with the group Gy is present, the non-volatile register control circuit ($102$) may set the dirty bit DTYz to the second value (logic 1). Assume that volatile data is written to the holding circuit in the non-volatile register having the address Ax belonging to the group Gy. Then, when the dirty bit DTYz associated with the group Gy is present, the non-volatile register control circuit ($102$) may set the dirty bit DTYz to the second value (logic 1). Assume that the data held in the non-volatile element is loaded to the holding circuit of each of the non-volatile registers belonging to the group Gy. Then, when the dirty bit DTYz associated with the group Gy is present, the dirty bit DTYz may be set to the first value (logic 0). Assume that the data held in the holding circuit is written to the non-volatile element of each of the non-volatile registers belonging to the group Gy. Then, when the dirty bit DTYz associated with the group Gy is present, the dirty bit DTYz may be set to the second value (logic 1).

Assume that the instruction decoded by the decoder is the write instruction for the non-volatile element in the non-volatile register having the address Ax. Then, when the dirty bit DTYz associated with the group Gy to which the non-volatile register having the address Ax belongs is present, and when the dirty bit DTYz has the second value (logic 1), the data held in the holding circuit may be written to the non-volatile element of the non-volatile register having the address Ax. When the dirty bit DTYz has the first value (logic 0), it may be so controlled that the data held in the holding circuit is not written to the non-volatile element of the non-volatile register having the address Ax.

Further, according to the exemplary embodiment of the present invention, addresses A1 to Am of the m non-volatile registers are divided into t groups G1 to Gt. The instruction specifies one address Ax belonging to one group Gy ($1 \leq y \leq t$). In the case where the decoded instruction is the write instruction for the non-volatile element, the non-volatile register control circuit may perform control such that the data held in the holding circuit is written to the non-volatile element in each of all of the non-volatile registers belonging to the group Gy. In the case where the decoded instruction is the load instruction from the non-volatile element, the non-volatile register control circuit may perform control such that the data held in the non-volatile element is loaded to the holding circuit in each of all of the non-volatile registers belonging to the group Gy.

According to the exemplary embodiment of the present invention, the semiconductor device performs a pipeline operation, in which the write instruction for the non-volatile element is read from the storage equipment in a first cycle; and in a second cycle subsequent to the first cycle, a write current is supplied so as to perform writing to the non-volatile element, and also in the same second cycle, a subsequent instruction is read from the storage equipment.

Exemplary embodiments of the present invention will be described, with reference to drawings.

FIRST EXEMPLARY EMBODIMENT

FIG. 1 is a diagram illustrating a configuration of a first exemplary embodiment of the present invention. Referring to FIG. 1, a semiconductor integrated circuit (LSI) includes a storage equipment 100, an instruction decoder 101, a non-volatile register control circuit 102, and a plurality of (m units) of non-volatile registers $103_1$ to $103_m$.

Each of the plurality of non-volatile registers $103_1$ to $103_m$ includes a plurality of (n units) of non-volatile flip-flops $104_1$ to $104_n$. The non-volatile flip-flops $104_1$ to $104_n$ are set to have a same configuration, and each unit of the non-volatile flip-flops $104_1$ to $104_n$ is denoted as a "non-volatile flip-flop 104" as well.

The non-volatile flip-flop 104 includes a holding circuit configured to hold data in a volatile manner (in which retention data disappears when power is turned off), and a non-volatile element configured to hold the data in a non-volatile manner (in which the retention data is held even when a power is turned off).

The non-volatile flip-flop 104 is equipped with a function of data transfer between the holding circuit and the non-volatile element in the non-volatile flip-flop 104.

Transfer of data held in the holding circuit to the non-volatile element in the non-volatile flip-flop 104 is referred to as "writing" to the non-volatile element.

Transfer of data held in the non-volatile element to the holding circuit in the non-volatile flip-flop 104 is referred to as "loading" from the non-volatile element.

Each of the non-volatile registers $103_1$ to $103_m$ in FIG. 1 is constituted from the n units of non-volatile flip-flops $104_1$ to $104_n$. The value of n may differ for each non-volatile register 103. In many cases, however, the value of n is the same for each of the non-volatile registers $103_1$ to $103_m$.

Addresses A1 to Am are respectively allocated to the m units of the non-volatile registers $103_1$ to $103_m$. There are shown in FIG. 1, for example, though not limited thereto, a program counter (PC: Program Counter), a stack pointer (SP: Stack Pointer), and a status register (SR: Status Register), as the non-volatile registers $103_1$ to $103_3$ having the addresses A1, A2, and A3. In addition to the components shown in FIG. 1, the non-volatile registers 103 include also general-purpose registers and registers in a peripheral module. Values of these non-volatile registers $103_1$ to $103_m$ indicate an internal state of the semiconductor integrated circuit, for example.

That is, by saving values of the holding circuits in the non-volatile registers 103 to the non-volatile elements, turning off a power, turning on the power after a while, and then restoring data stored in the non-volatile elements to the original holding circuits, an operation of the semiconductor integrated circuit can be returned to a state before being suspended.

In a semiconductor integrated circuit of a related art using volatile flip-flops alone includes:

a flip-flop having an address assigned thereto, so as to perform writing and reading by specification; and a flip-flop with no address assigned thereto.

in this exemplary embodiment, in the case where data is to be restored in a flip-flop having no address assigned thereto as well, after a power is turned on, an address may be assigned to the flip-flop.

Each of these flip-flops is equipped with a function whereby writing to or loading from the non-volatile element can be performed by specification of the address using software, for example. The function whereby writing to or loading from the holding circuit can be directly performed by the software is not necessarily needed.

An instruction set (a set of instructions that can be executed by the semiconductor integrated circuit) in the semiconductor integrated circuit includes a non-volatile register control instruction configured to control each non-volatile register. The process from reading of an instruction to control of the non-volatile register will be briefly explained. Detailed operation explanation will be made later. First, a central processing unit outputs an address designated by the program counter PC (non-volatile register $103_1$), and reads the instruction stored at that address from the storage equipment 100. Though the storage equipment 100 is provided in the semiconductor integrated circuit, the storage equipment 100 may be provided outside the semiconductor integrated circuit. The storage equipment 100 may be a memory module or the like (such as a DIMM (Dual Inline Memory Module) including a DRAM (dynamic random access memory) or the like. Alternatively, the storage equipment 100 may be a cache memory including an SRAM (static random access memory) or the like. Alternatively, the storage equipment 100 may be an instruction cache or the like, that is provided in the semiconductor integrated circuit and configured to store a pre-fetched instruction. Alternatively, the storage equipment 100 may be a ROM (read only memory) provided within the semiconductor integrated circuit or externally provided. Further, the storage equipment 100 may be a different arbitrary storage equipment if the storage equipment 100 can store an instruction and read the instruction by supplying the address of the instruction.

The instruction decoder 101 is configured to decode the instruction read from the storage equipment 100.

When an instruction decoded by the instruction decoder 101 is a write instruction for the non-volatile element, the non-volatile register control circuit 102 writes data held in the holding circuit to the non-volatile element in the non-volatile flip-flop 104 in the non-volatile register 103 specified by the instruction.

When the instruction decoded by the instruction decoder 101 is a load instruction for the non-volatile element, the non-volatile register control circuit 102 loads data held in the non-volatile element to the holding circuit in the non-volatile flip-flop of the non-volatile register 103 specified by the instruction.

Figure 2:
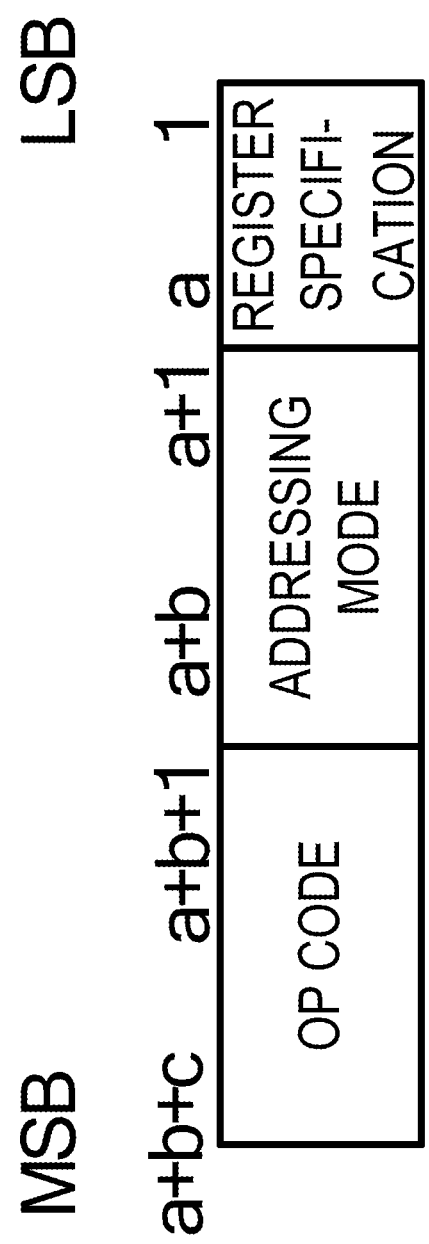
FIG. 2 is a diagram illustrating an example of an instruction format in the first exemplary embodiment of the present invention.

A control instruction for the non-volatile register may use a single operand instruction format. FIG. 2 illustrates an example of the single operand instruction format.

The instruction including from (a+b+c) bits uses a-bits from an LSB (Least Significant Bit) for specifying a register.

The instruction uses b-bits ranging from (a+1)th bit to (a+b)th bit for specifying an addressing mode.

The instruction uses c bits ranging from (a+b+1)th bit to (a+b+c)th bit for specifying an operation-code (op-code).

According to this exemplary embodiment, by adding the control instruction for each non-volatile register to the instruction code, the non-volatile registers 103 can be controlled without greatly changing the existent architecture.

When writing is performed to the non-volatile register of the register number: 4, for example, the bits for specifying the register in the instruction code, should be set to specify the register number: 4, the addressing mode in the instruction code should be set to a mode that is for manipulating the register and that is usually available, and the op code in the instruction code should be set to a newly-added write instruction for the non-volatile register. Another addressing mode may also be used as the addressing mode.

As a variation example of this exemplary embodiment, the m non-volatile registers $103_1$ to $103_m$ with the addresses A1 to Am may be divided into a plurality of groups. It may be so arranged, for example, that when an address for the non-volatile register is specified by the instruction, a plurality of the non-volatile registers in a group to which the non-volatile registers having that the specified address belongs can also be simultaneously controlled.

When writing is performed to two non-volatile registers with the consecutive register numbers of 4 and 5 belonging to the same group, for example, the bit field of the instruction in FIG. 2 for specifying the register should be set to specify the register number of 4, the addressing mode of the instruction should be set to the mode that is for manipulating the register and that is usually available, and the op code of the instruction should be set to the newly-added write instruction for the non-volatile register.

The non-volatile register control circuit 102 may be configured to decode the address, ignoring the least significant bit (LSB: Least Significant Bit) of the address, for example. In this case, "100" that are the bits for specifying the register number of 4 and "101" that are the bits for specifying the register number of 5 are simultaneously selected. Simultaneous operation of a plurality of the non-volatile registers in this manner leads to saving (reduction) of a time for controlling the non-volatile registers in the non-volatile register control circuit 102.

In Patent Literature 2 described above, writing to and loading from all registers in a module are performed. Thus, a writing operation to a non-volatile element to which the writing is not necessary, are a load operation from a non-volatile element from which the loading is not necessary occur. Wasteful power is thereby consumed.

On contrast therewith, according to this exemplary embodiment, writing to and loading from a group to which the specified register belongs are performed. Wasteful power for saving and restoring data can be thereby reduced, while reducing temporal overhead for saving and restoring the data.

Figure 3:
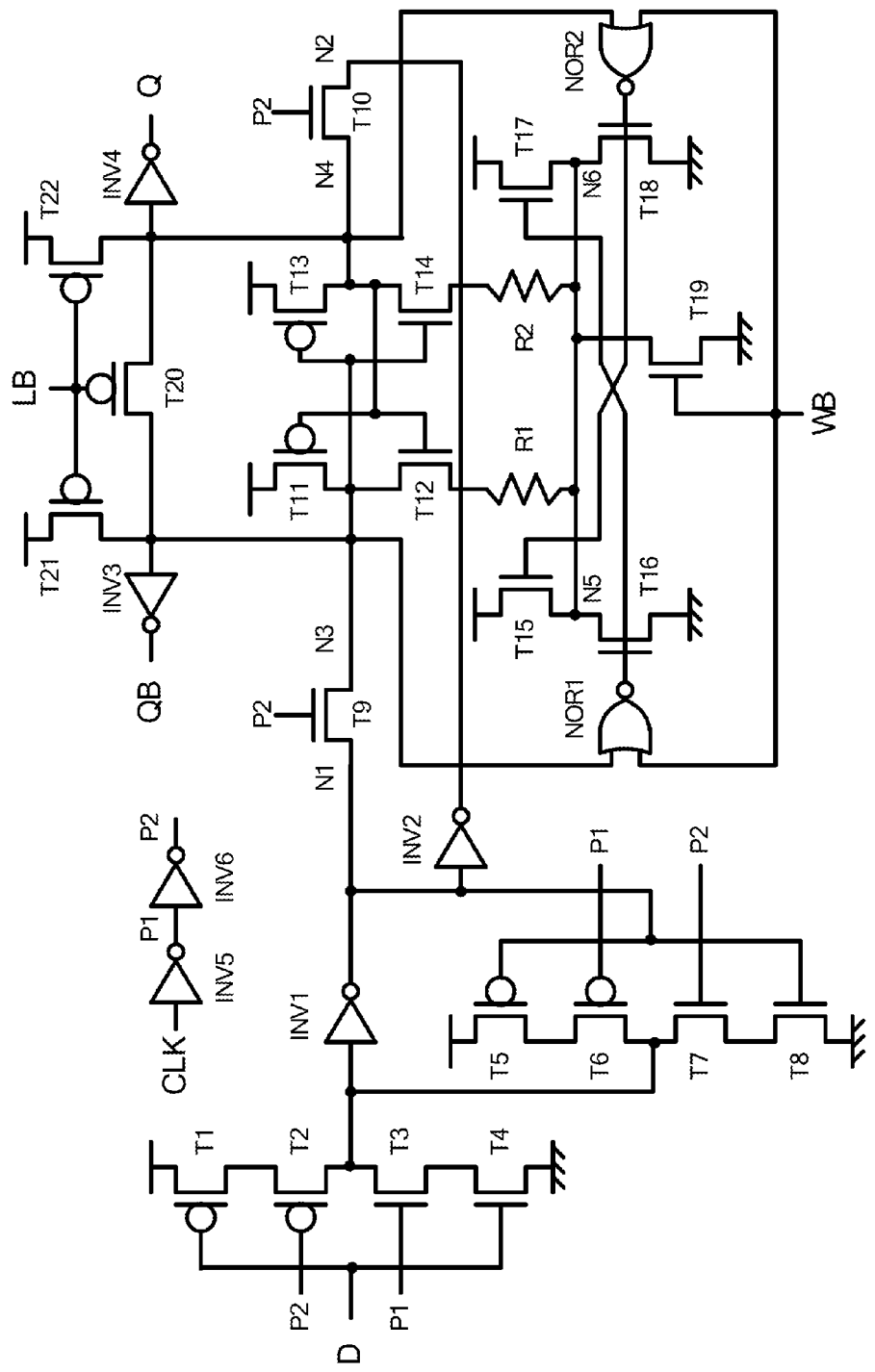
FIG. 3 is a diagram illustrating a configuration of a flip-flop of a non-volatile register in the first exemplary embodiment of the present invention.

FIG. 3 is a diagram illustrating an example of the non-volatile flip-flop 104 in the first exemplary embodiment of the present invention.

Referring to FIG. 3, the non-volatile flip-flop 104 includes a non-volatile element (R1, R2), a master latch (T1 to T4, INV1, INV2, T5 to T8), and a slave latch (T11, T12, T13, T14).

In this exemplary embodiment, data exchange is performed between the slave latch and the non-volatile element. Specifically, the non-volatile flip-flop 104 includes a function of writing data in the slave latch to the non-volatile element and a function of loading the data from the non-volatile element to the slave latch.

The non-volatile flip-flop 104 may be configured to have the following different configuration. The non-volatile flip-flop with the different configuration may include a function of writing data held in the master latch to the non-volatile element and a function of loading the data from the non-volatile element to the master latch. Alternatively, the non-volatile flip-flop with the different configuration may include a function of writing the data held in the master latch to the non-volatile element and a function of loading the data from the non-volatile element to the slave latch. Alternatively, the non-volatile flip-flop with the different configuration may include a function of writing the data held in the slave latch to the non-volatile element and a function of loading the data from the non-volatile element to the master latch.

As shown in FIG. 3, the master latch includes a first clocked inverter (T1 to T4), the first inverter INV1, a second clocked inverter (T5 to T8), and the second inverter INV2. The first clocked inverter comprises:

a PMOS transistor T1 having a source connected to a power supply (VDD) and a gate connected to a data terminal D;

a PMOS transistor T2 having a source connected to a drain of the PMOS transistor T1 and a gate connected to an output P2 (that is the output of an inverter INV6 through an inverter INV5 configured to invert a clock signal CLK, the output P2 being in phase with the clock signal CLK);

an NMOS transistor T3 having a drain connected to a drain of the PMOS transistor T2 and a gate connected to an output P1 (that is the output of the inverter INV5 configured to invert the clock signal CLK); and an NMOS transistor T4 having a drain connected to a source of the NMOS transistor T3, a source connected to a ground (GND), and a gate connected to the data input terminal D.

An input of the first inverter INV1 is connected to an output of the first clocked inverter (at a connection point between the drains of the transistors T2 and T3).

The second clocked inverter comprises:

a PMOS transistor T5 having a source connected to the power supply and a gate thereof connected to an output of the first inverter INV1;

a PMOS transistor T6 having a source connected to a drain of the PMOS transistor T5 and a gate thereof connected to the output P1;

an NMOS transistor T7 having a drain connected to a drain of the PMOS transistor T6 and a gate connected to the output P2; and an NMOS transistor T8 having a drain connected to a source of the NMOS transistor T7, a source connected to the ground (GND), and a gate connected to the output of the first inverter INV1.

An input of the second inverter INV2 is connected to the output of the first inverter INV1. The first inverter INV1 and the second clocked inverter (T5 to T8) constitute a holding circuit (bi-stable circuit). That is, when the clock signal CLK is High, the output P1 is Low, and the output P2 is High, the second clocked inverter (transistors T5 to T8) is activated (turns on) to operate as an inverter, thereby forming a flip-flop with the first inverter INV1.

When the clock signal CLK is Low, the output P1 is High, and the output P2 is Low, a signal at the data input terminal D is inverted by the first clocked inverter (T1 to T4) and is supplied to the first inverter INV1. The first inverter INV1 inverts the signal received. In this case, the second clocked inverter (T5 to T8) is turned off.

When the output P1 is Low and the output P2 is High, the first clocked inverter (T1 to T4) is turned off (and the signal at the data input terminal D is not transmitted to the first inverter INV1), and the second clocked inverter (T5 to T8) is turned on. The first inverter INV1 and the second clocked inverter (T5 to T8) in an on state thereby constitute the flip-flop (bi-stable circuit). Data in the master latch is held in a node N1. Data obtained by inversion by the second inverter INV2 is held in a node N2.

The data held in the nodes N1 and N2 are respectively supplied to holding nodes N3 and N4 of the slave latch through transistors (pass transistors) T9 and T10 that are turned on when the output P2 is High (when the clock signal CLK is High). When the output P2 is Low (when the clock signal CLK is Low), the transistors T9 and T10 are turned off, so that the node N1 and the node N3 of the slave latch are electrically disconnected and the node N2 and the node N4 of the slave latch are electrically disconnected.

The slave latch includes:
PMOS transistors T11 and T13 having sources connected to the power supply (VDD); and
NMOS transistors T12 and T14 having drains respectively connected to drains of the PMOS transistors T11 and T13. Commonly coupled gates (an input node of a first CMOS inverter) of the transistors T11 and T12 (the first CMOS inverter) are connected to the node N4.

Commonly coupled drains (an output node of the first CMOS inverter) of the transistors T11 and T12 are connected to the node N3.

Commonly coupled gates (an input node of a second CMOS inverter) of the transistors T13 and T14 (the second CMOS inverter) are connected to the node N3.

Commonly coupled drains (an output node of the second first CMOS inverter) of the transistors T13 and T14 are connected in common to the node N4. The transistors T11, T13, T12, and T14 constitute a holding circuit.

The slave latch further includes:
a non-volatile element R1 having a first terminal connected to a source of the transistor T12 and a second terminal connected to a connecting node N5 between transistors T15 and T16; and
a non-volatile element R2 having a first terminal connected to a source of the transistor T14 and a second terminal connected to a connecting node N5 between the transistors T15 and T16 and a connecting node N6 between transistors T17 and T18. When each of the non-volatile elements R1 and R2 is constituted from a ferromagnetic tunnel junction element (MTJ), third terminals of the non-volatile elements R1 and R2 are coupled together.

The slave latch further includes:
NMOS transistors T15 and T17 having drains connected to the power supply; and
NMOS transistors T16 and T18 having drains respectively connected to sources of the NMOS transistors T15 and T17 and sources connected to the ground (GND).

Figure 4:
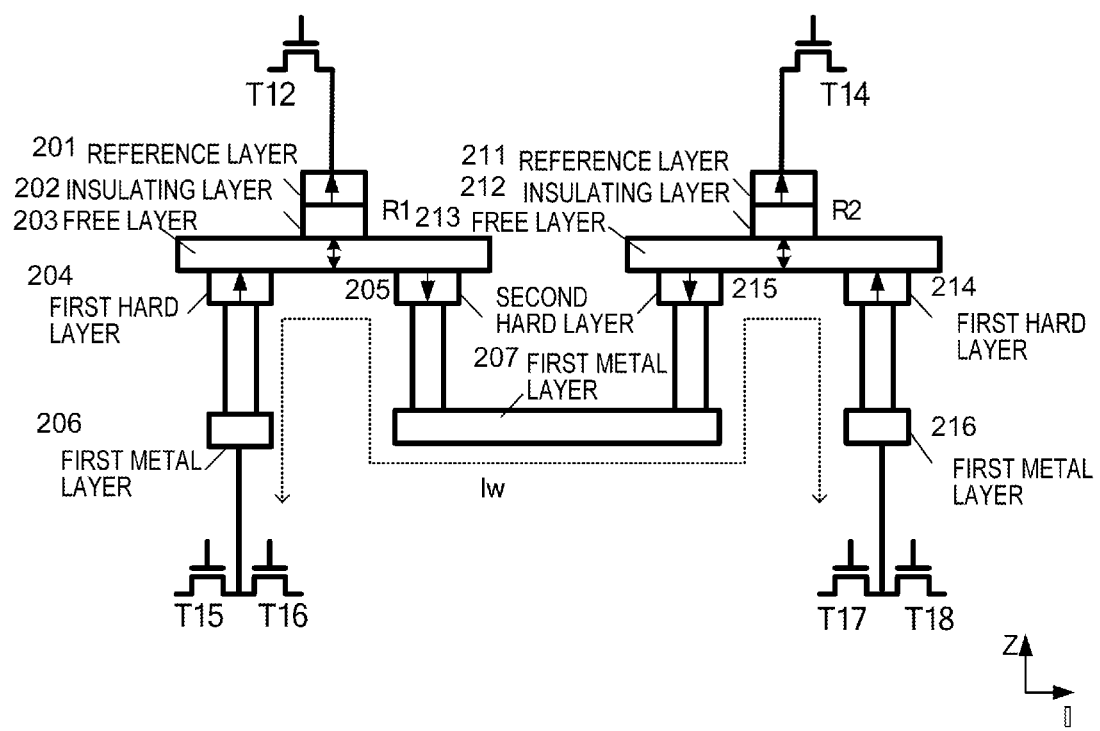
FIG. 4 is a diagram schematically showing a configuration of a section of a non-volatile element in the first exemplary embodiment of the present invention.

Commonly coupled drains (N5) of the transistors T15 and T16 and commonly coupled drains (N6) of the transistors T17 and T18 are connected together (connected through a metal layer that connect hard layers of the non-volatile elements, as shown in FIG. 4 that will be described later).

The slave latch further includes:
an NMOS transistor T19 having a drain connected to a connection node between the nodes N5 and N6 (a first metal layer (207) in FIG. 4 that will be described later), a source connected to the GND, and a gate configured to receive a control signal WB (that goes Low when writing is performed). When the control signal WB is High, or when writing is not performed, the transistor T19 turns on to connect the sources of the transistors T12 and T14 to the GND through the non-volatile elements R1 and R2. The transistors T15 to T18 constitute a writing transistor.

The slave latch further includes:
a two-input NOR circuit NOR1 for writing, having an output connected to gates of the transistors T16 and T17; and
a two-input NOR circuit NOR2 for writing, having an output connected to gates of the transistors T18 and T15.

An input of the two-input NOR circuit NOR1 is connected to the node N3 and the control signal WB.

An input of the two-input NOR circuit NOR2 is connected to the node N4 and the control signal WB.

When the control signal WB is Low, the two-input NOR circuits NOR1 and NOR2 respectively output signals that are inverted version of signals at the nodes N3 and N4.

The slave latch further includes:
a PMOS transistor T21 connected between the power supply and the node N3;
a PMOS transistor T22 connected between the power supply and the node N4; and
a PMOS transistor T20 connected between the node N3 and the node N4.

Gates of the transistors T20 to T22 are connected in common to a control signal LB.

The transistors T20 to T22 constitute a precharging and equalizing circuit. When the control signal LB is Low, the precharging and equalizing circuit precharges and equalizes potentials at the nodes N3 and N4 to a power supply potential.

The slave latch further includes inverters (inverting buffers) INV3 and INV4 for output with input terminals thereof connected to the nodes N3 and N4.

Complementary data (data at the nodes N3 and N4) latched in the holding circuit composed by the transistors T11 to T14 in the slave latch are respectively supplied to first inputs of the two-input NOR circuits NOR1 and NOR2. The control signal WB for writing is supplied to the gate of the transistor T19 and second inputs of the NOR circuits NOR1 and NOR2. Outputs of the NOR circuits NOR1 and NOR2 are respectively connected to the gates of the transistors T17 and T15.

The load signal LB is supplied to the gates of the transistors T20 to T22. When the load signal LB is Low, the nodes N3 and N4 are precharged and equalized to the power supply potential.

An output signal Q is output from the inverter INV4 having an input connected to the node N3. An output signal QB is output from the inverter INV3 having an input connected to the node N4.

The clock signal CLK is supplied to the inverters INV5 and INV6 connected in cascade, and clock signals P1 and P2 that are complementary and have been respectively generated by the inverter INV5 and the inverter INV6 are supplied to each clocked inverter. The clock signal P2 is also supplied to gates of the transistors T9 and T10.

The non-volatile flip-flop shown in FIG. 3 includes, in addition to a function of an existent flip-flop, the following functions:

being capable of writing data electrically stored in the holding circuit of the slave latch to the non-volatile element; and being capable of reading data held in the non-volatile element and holding the read data in the holding circuit of the slave latch.

A ferromagnetic tunnel junction element (MTJ (Magnetic Tunnel Junction) element) that utilizes a magnetic resistance effect, for example, is used as the non-volatile element.

The MTJ element herein includes a configuration in which a ferromagnetic layer (fee layer) whose magnetization direction changes, a ferromagnetic layer (fixed layer) whose magnetization direction is fixed, and an insulating layer formed between the free layer and the fixed layer. The value of resistance when a current is flown in a direction normal to the film surface of such an MTJ element, changes according to the magnetization directions of the free layer and the fixed layer.

When magnetization of the free layer is parallel with magnetization of the fixed layer, the value of resistance is reduced.

When magnetization of the free layer is anti-parallel with magnetization of the fixed layer, the value of resistance increases.

In the MTJ element, this resistance value or the magnetization direction of the free layer is associated with logical data, using this property. To take an example, a low resistance state is set to the logical value "0", and a high resistance state is set to the logical value of "1".

As a writing method of the MTJ element, a magnetic field writing method and a spin torque writing method are known. In the magnetic field writing method, the magnetization direction of the fee layer is controlled using a current magnetic field. In the spin torque writing method, the magnetization direction is controlled, using a spin torque effect.

FIG. 4 is a diagram schematically illustrating a cross section in the vicinity of a magnetic domain wall moving element configured to perform writing using the spin torque effect, as a non-volatile element. Transistors (transistors T12, T14, T15, T16, T17, and T18 in FIG. 3) connected to the non-volatile element are all illustrated by circuit diagram symbols. This non-volatile element includes in order of distance from a substrate:

first metal layers (206, 207, 216));
first hard layers (204, 214), second hard layers (205, 215);
free layers (203, 213);
insulating layers (202, 212); and
reference layers (201, 211).

In a non-volatile element R1, the reference layer 201 is connected to the transistor T12 of the non-volatile register, and the first hard layer (204) is connected to a connection point between the transistors T15 and T16.

The second hard layer (205) is connected to a connection point between the transistors T17 and T18 through the first metal layer (207), the second hard layer (215), and the first hard layer (214) of a non-volatile element R2.

As an example, each of the free and hard layers uses a magnetic thin film having perpendicular magnetic anisotropy. Directions of magnetization of the first hard layer (204) and the second hard layer (205) are fixed to be opposite. Magnetization of the free layer (203) can be controlled up and down in a Z direction according to orientation of a spin-polarized current. When a current is flown from the first hard layer (204) to the second hard layer (205), polarized electrons flow in an opposite direction, and magnetization of the free layer (203) is aligned in a direction the same as the direction of magnetization of the second hard layer (205). Conversely, when the current is flown from the second hard layer (205) from the first hard layer (204), magnetization of the free layer (203) is aligned in a direction the same as the direction of magnetization of the first hard layer (204). This principle also applies to the non-volatile element R2.

The following describes a write operation to the non-volatile register with reference to FIG. 3. When the write operation is performed, the control signal WB for writing is set to a Low potential. Write data for the non-volatile elements R1 and R2 corresponds to data Q in the slave latch. In the case where the output data Q of the inverter INV4 is "0" (supposed to be a Low potential), the node N4 assumes the power supply potential (High potential), the node N3 assumes a Low potential, the output of the NOR circuit NOR2 is Low, and the output of the NOR circuit NOR1 is High. Thus, the transistors 16 and 17 turn on, and the transistors T15 and T18 turn off. In this case, a write current flows from the node N6 (at a High potential) to the node N5 (at a Low potential). With this arrangement, the resistor R1 of the non-volatile element assumes a low resistance state, and the resistor R2 of the non-volatile element assumes a high resistance state. The non-volatile element stores data "0" corresponding to the data Q.

On the other hand, in the case where the data Q is "1" (High potential), the node N3 assumes the power supply potential (High potential), the node N4 assumes a Low potential, the output of the NOR circuit NOR1 is Low, and the output of the NOR circuit NOR2 is High. Thus, the transistors 16 and 17 turn off, and the transistors T15 and T18 thereby turn on. In this case, a write current flows from the node N5 (at a High potential) to the node N6 (at a Low potential). With this arrangement, the resistor R1 of the non-volatile element assumes a low resistance state, and the resistor R2 of the non-volatile element assumes a high resistance state. The non-volatile element stores data "1" corresponding to the data Q.

The following describes a load operation from the non-volatile register with reference to FIG. 3. When the load operation is performed, the load signal LB is set to a Low potential. The clock signal CLK is set to a Low potential, the output P1 is set to a High potential, and the output P2 is set to a Low potential. The transistors T20, T21, and T22 turn on, so that the nodes N3 and N4 are precharged and equalized to a High potential (power supply potential).

The transistor T12 having a gate supplied with a High potential at the node N4 is turned on, so that a read current flows from the power supply to the non-volatile element R1 through the node N3 and the transistor T12. The transistor T14 that receives the High potential at the node N3 is turned on, so that a read current flows from the power supply through the non-volatile element R2 through the node N4 and the transistor T14. When the load operation is performed, the control signal WB for writing is set to High, so that the transistor T19 is turned on and read currents flowing through the non-volatile elements R1 and R2 flow into the ground GND. According to a difference between these read currents, a minute potential difference occurs between the nodes N3 and N4.

Then, upon change of the load signal LB from Low to High, the transistors 20 to 22 turn off and the potential difference between the nodes N3 and N4 is amplified by the holding circuit (differential latch) composed by the transistors T11 to T14. In the case where data stored in the non-volatile element is "0", the resistor R1 of the non-volatile element is in a low resistance state, and the resistor R2 of the non-volatile element is in a high resistance state. Thus, the node N3 becomes Low, and the node N4 becomes High. The potential at the node N4 is inverted by the inverter INV4, so that an output terminal Q is Low. That is, data at the output terminal Q assumes "0" corresponding to the data held in the non-volatile element.

On the other hand, in the case where data stored in the non-volatile element is "1", the resistor R1 of the non-volatile element is in a high resistance state, and the resistor R2 of the non-volatile element is in a low resistance state. Thus, the node N3 becomes High, and the node N4 becomes Low, so that the output terminal Q becomes "1" High. That is, data at the output terminal Q assumes corresponding to the data held in the non-volatile element.

Figure 5:
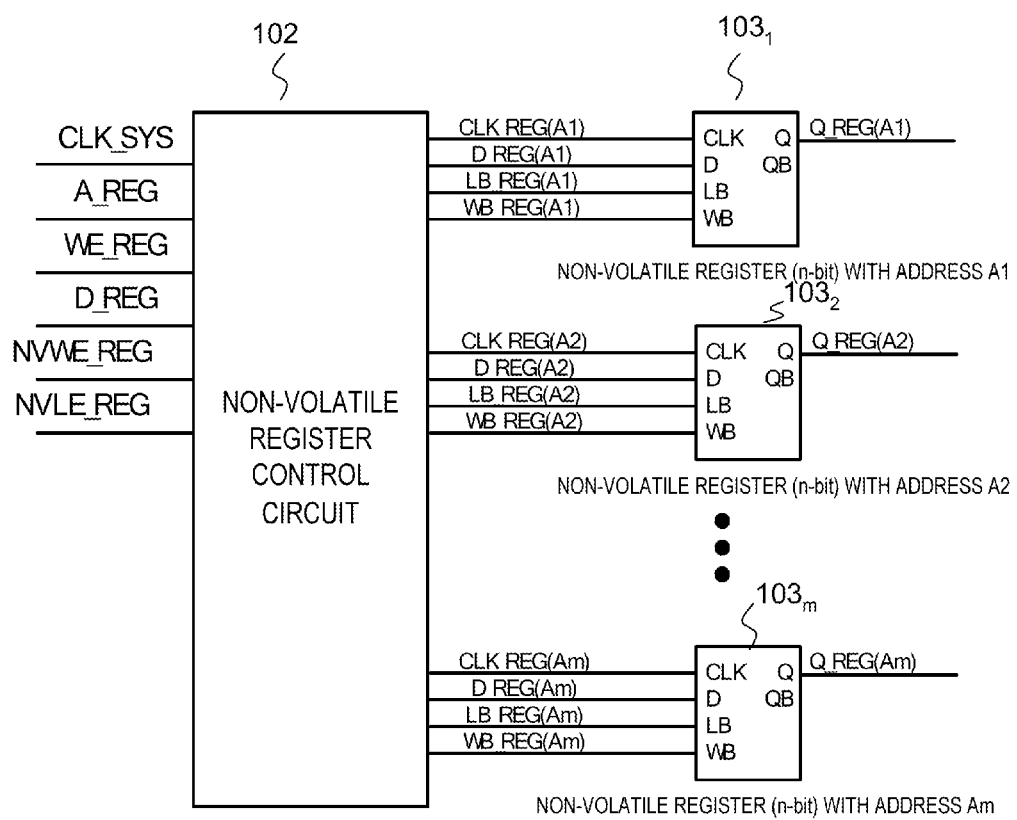
FIG. 5 is a diagram illustrating a connection configuration of each of non-volatile registers and a non-volatile register control circuit in the first exemplary embodiment of the present invention.

FIG. 5 is a diagram illustrating a configuration of the non-volatile registers and the non-volatile register control circuit (102 in FIG. 1) in the semiconductor integrated circuit according to the first exemplary embodiment of the present invention. The address A1 is allocated for every n units of the non-volatile flip-flops 104 constituting the non-volatile register 103. For example, n is a word unit of 16 bits, a byte unit of 8 bits, or the like.

The addresses for the non-volatile registers are m addresses from the address A1 to the address Am. Typically, when an address is specified, n units of the non-volatile flip-flops 104 constituting non-volatile register 103 having the address can be simultaneously controlled. Alternatively, it may be so arranged that, when an address is specified, a plurality of the non-volatile registers in a certain address region can be simultaneously controlled.

The following signals are supplied to the non-volatile register control circuit 102:
  a system clock signal: CLK_SYS;
  a register address signal: A_REG;
  a write enable signal for volatile data to the register: WE_REG;
  input data to the register: D_REG;
  a write enable signal for the non-volatile element: NVWE_REG; and
  a load enable signal from the non-volatile element: NVLE_REG.

The non-volatile register control circuit 102 outputs non-volatile register control signals to each non-volatile register 103, based on the received control signals.

The non-volatile register control signals supplied to the non-volatile register having an address A1 are as follows:
  a clock signal: CLK_REG (A1);
  input data: D_REG (A1);
  a load signal (Low active): LB_REG (A1); and
  a control signal for writing (Low active): WB_REG (A1).

The non-volatile register 103 having the address A1 outputs an output signal Q_REG (A1). Each of the non-volatile registers $103_2$ to $103_m$ having addresses A2 to Am performs the similar operation.

Figure 6:
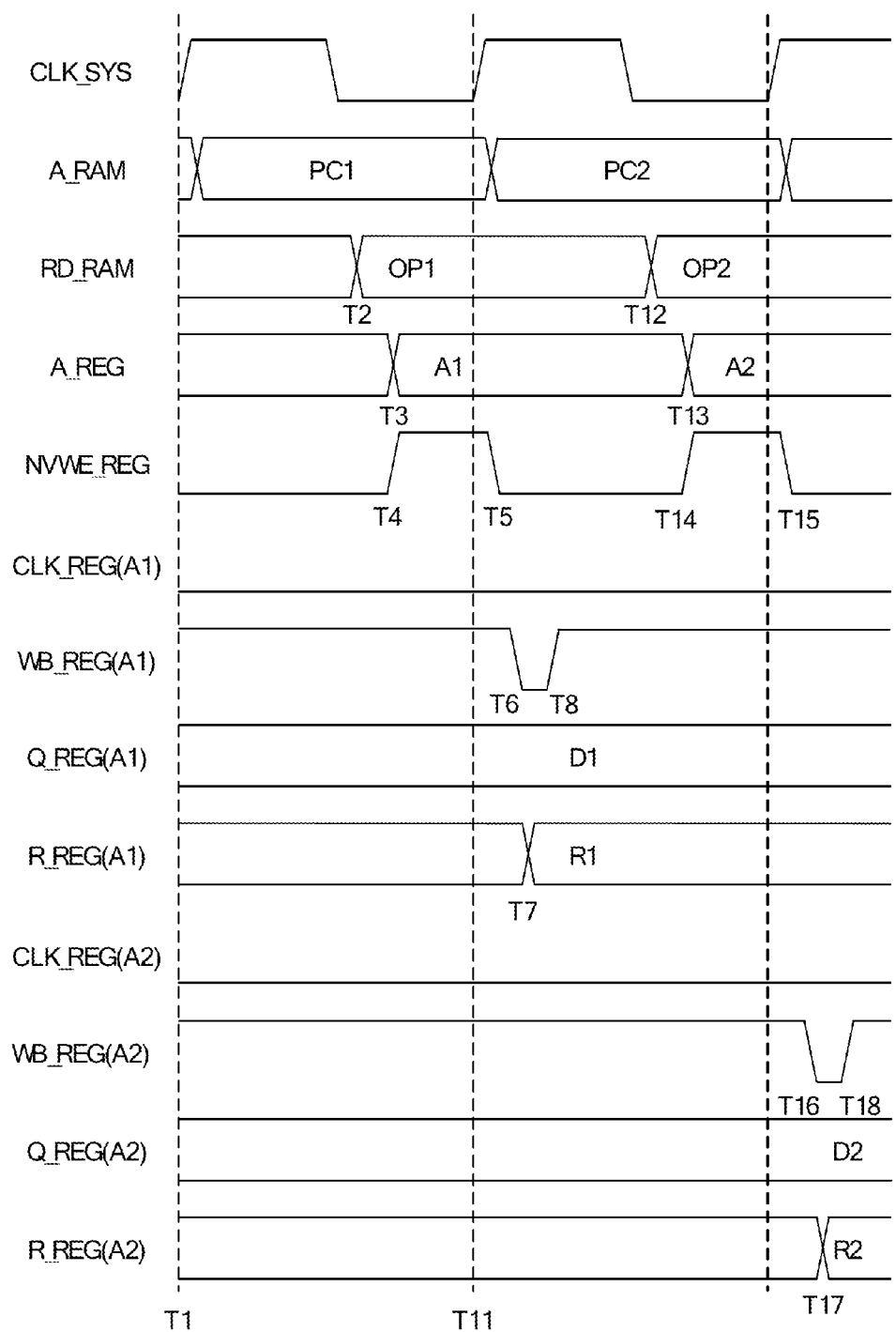
FIG. 6 is a diagram illustrating examples of operation waveforms when writing is performed to the non-volatile element in the first exemplary embodiment of the present invention.

FIG. 6 is a diagram illustrating examples of operation waveforms when an op code is a write instruction for the non-volatile element in the semiconductor integrated circuit in the first exemplary embodiment of the present invention shown in FIG. 5. FIG. 6 illustrates timing waveforms of the following signals:
  the system clock signal: CLK_SYS;
  an address: A_RAM
  data at the address A_RAM: RD_RAM
  the address of the register: A_REG;
  the write enable signal for the non-volatile element: NVWE_REG;
  the clock for the address A1: CLK_REG (A1);
  the control signal WB for writing to the address A1: WB_REG (A1);
  data at the address A1: Q_REG (A1);
  a resistance value of the non-volatile element having the address A1: R_REG (A1);
  a clock for the address A2: CLK_REG (A2);
  a control signal WB for writing to the address A2: WB_REG (A2);
  data at the address A2: Q_REG (A2); and
  a resistance value of the non-volatile element having the address A2: R_REG (A2).

The following describes an operation when writing is performed to the non-volatile element, with reference to FIGS. 5 and 6. Immediately after a time T1, a central processing unit outputs a program counter value PC1 to the storage equipment (100 in FIG. 1), as the address A_RAM.

At a time T2, the central processing unit receives an instruction OP1, as the data at the address A_RAM of the storage equipment (100 in FIG. 1). The instruction OP1 herein has an instruction format shown in FIG. 2, and the op code of the instruction is an op code for performing the writing to the non-volatile element.

It is assumed that the addressing mode of the instruction OP1 has a single operand format to specify the register having the address A1.

At a time t3, the instruction decoder (101 in FIG. 1) of the central processing unit interprets the instruction OP1 to output the address A1 as the register address A_REG.

At a time T4, the instruction decoder (101 in FIG. 1) of the central processing unit decodes the op code of the instruction OP1 to output to the non-volatile register control circuit 102 the write enable signal NVWE_REG for the non-volatile element and finishes the output at a time T5.

During a period from a time T6 to a time T8, the non-volatile register control circuit 102 sets the control signal WB_REG (A1) for writing to the selected register having the address A1 to a Low level to make a write current flow in the non-volatile register 103.

At a time T7, the non-volatile element resistance value R_REG (A1) in the non-volatile register having the address A1 is rewritten to the resistance value R1 corresponding to the retention data Q_REG (A1) held in the holding circuit in the non-volatile register having the address A1.

The subsequent clock cycle illustrates operation waveforms when writing to the non-volatile element in the non-volatile register having the address A2 is performed. The writing is performed by a sequence of processes similar to those in the case of the address A1.

As shown in FIG. 6, the timings T6 and T8 at which the writing is performed to the non-volatile element may be later than a time T11 at which the cycle of reading a subsequent instruction from the storage equipment (100 in FIG. 1) starts. It is because the writing to the non-volatile element can be performed without changing the output of the non-volatile register, so that the writing does not interfere the operation of reading the subsequent instruction.

With the pipeline operation described above, a setup time sufficient for performing writing to the non-volatile element can be ensured. Along with this effect, a plurality of instructions can be executed in a short period of time.

Figure 7:
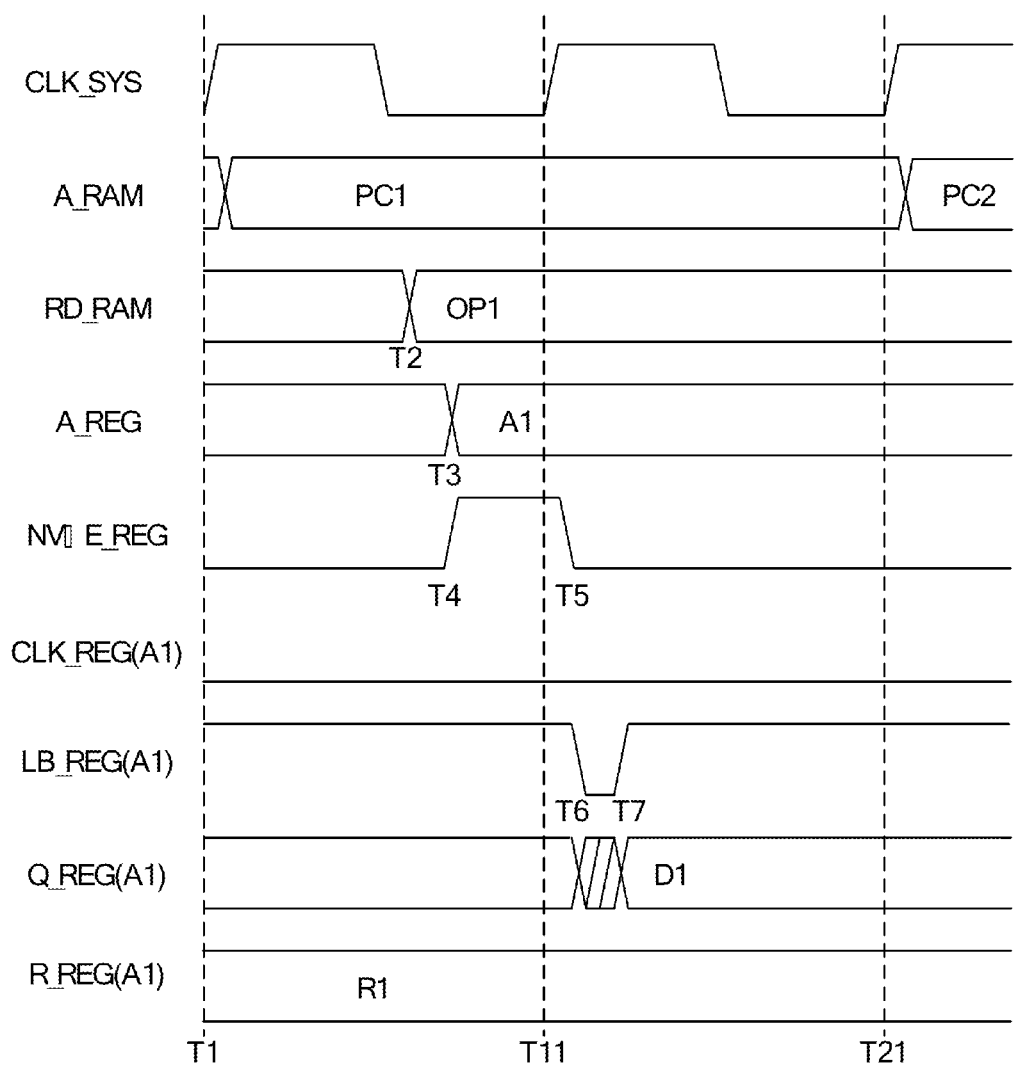
FIG. 7 is a diagram illustrating examples of operation waveforms when loading is performed from the non-volatile element in the first exemplary embodiment of the present invention.

FIG. 7 is a diagram illustrating examples of operation waveforms when the op code of the instruction (OP1) is a load instruction from the non-volatile element in the semiconductor integrated circuit in the first exemplary embodiment of the present invention. FIG. 7 illustrates timing waveforms of the signal CLK_SYS, the address A_RAM, the data RD_RAM, the address A_REG, the signal NVWE_REG, the clock CLK_REG (A1), the signal LB_REG (A1), the data Q_REG (A1), and the resistance value R_REG (A1). The following describes an operation when loading is performed from the non-volatile element with reference to FIG. 7.

Immediately after a time T1, the central processing unit outputs the program counter value PC1 to the storage equipment (100 in FIG. 1) as the address A_RAM.

At a time T2, the central processing unit receives the instruction OP1 as the data at the address A_RAM of the storage equipment (100 in FIG. 1). The instruction OP1 herein has the instruction format shown in FIG. 2, and the op code of the instruction is an op code for performing the loading from the non-volatile element. The addressing mode of the instruction OP1 has the single operand format to specify the register having the address A1.

At a time t3, the instruction decoder (101 in FIG. 1) of the central processing unit interprets the instruction OP1 to output the address A1 as the register address A_REG.

At a time T4, the instruction decoder of the central processing unit interprets the instruction OP1 to output the load enable signal NVLE_REG for the non-volatile element to the non-volatile register control circuit (102 in FIG. 1) and finishes the output at a time T5.

During a period from a time T6 to a time T8, the non-volatile register control circuit 102 sets the load signal WB_REG (A1) for the register having the selected address A1 to a Low level to perform the load operation in the non-volatile register.

At a time T7, the output data Q_REG (A1) of the non-volatile register having the address A1 is rewritten to an output D1 corresponding to the resistance value R1 of the non-volatile element resistance value R_REG (A1). The write operation may be completed before a time T11 of the subsequent cycle, as shown in FIG. 8

Figure 8:
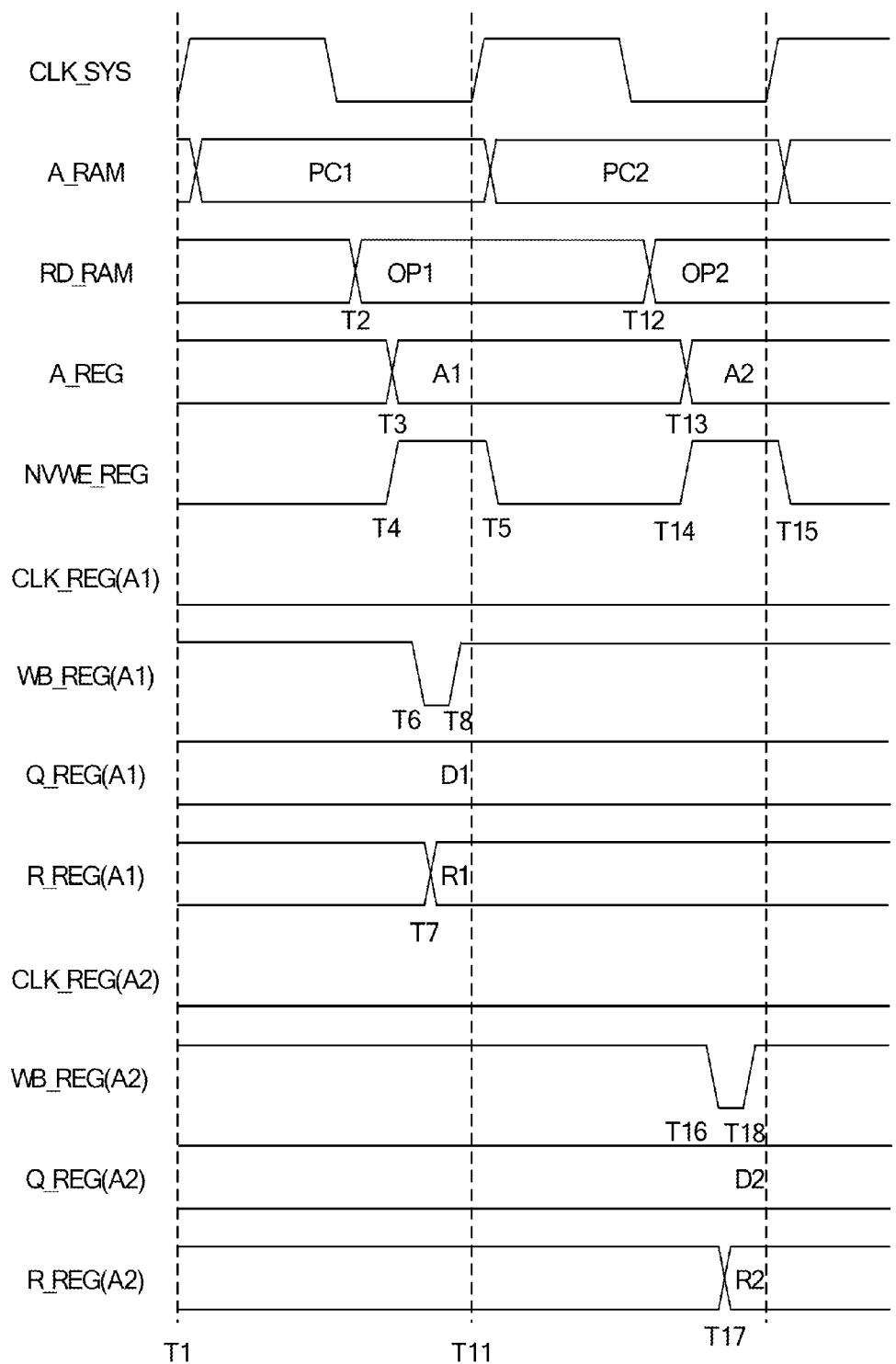
FIG. 8 is a diagram illustrating different examples of operation waveforms when writing is performed to the non-volatile element in the first exemplary embodiment of the present invention.

Operations from times T1 to T5 in FIG. 8 are the same as those in FIG. 6. FIG. 8 is different from FIG. 6 in that during a period from times T6 to T8 before a time T11, the non-volatile register control circuit 102 sets the control signal WB_REG (A1) for writing to the register having the selected address A1 to a Low level to make a write current flow in the non-volatile register 103.

At a time T7, the non-volatile element resistance value R_REG (A1) of the non-volatile register having the address A1 is rewritten to the resistance value R1 corresponding to the retention data Q_REG (A1).

At the time T11, the data held in the non-volatile register can change in synchronization with the system clock CLK_SYS. Referring to FIG. 8, the data before the time T11 is saved. On the other hand, the data after the time T11 is saved in the non-volatile element.

Figure 9:
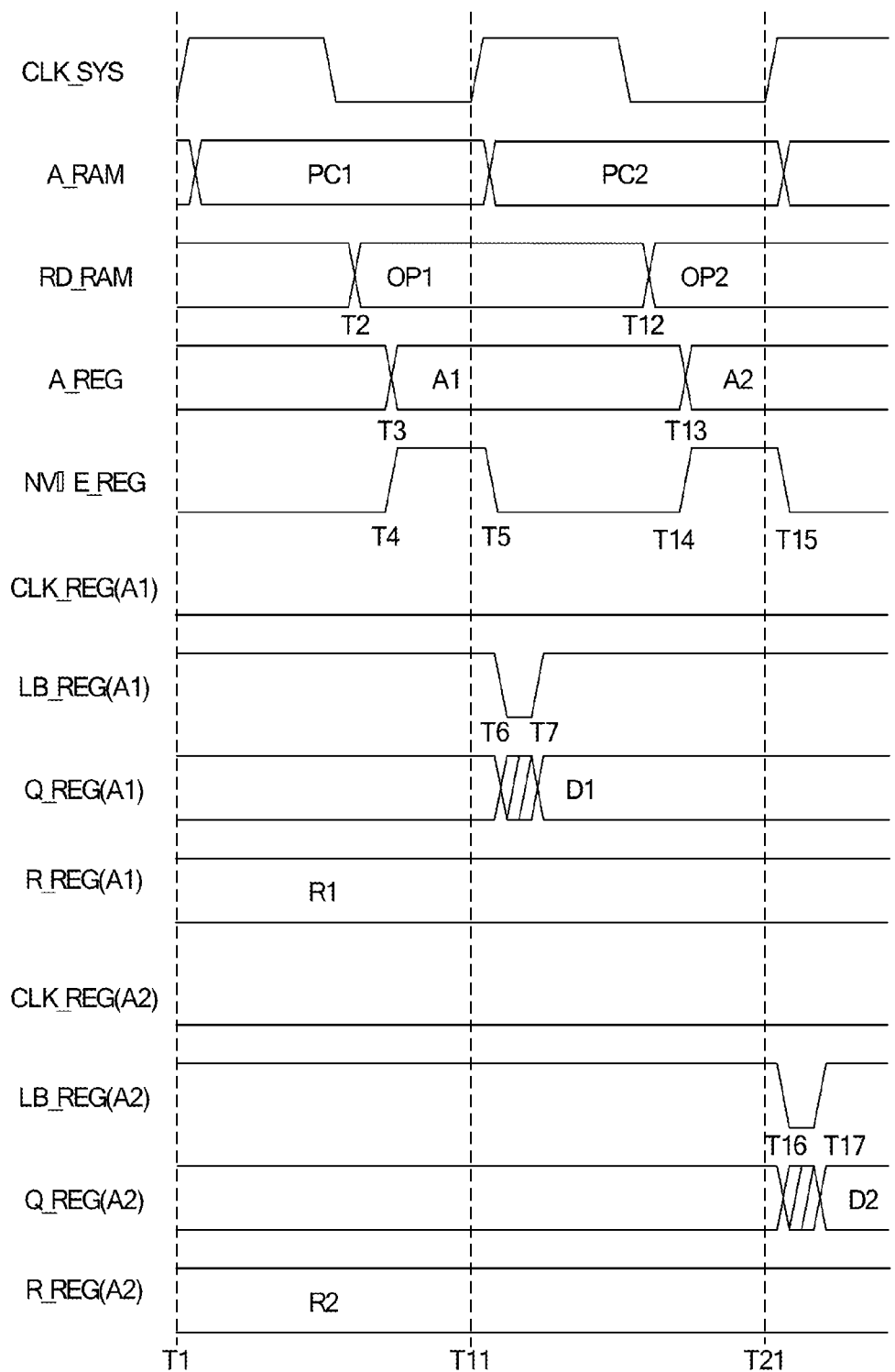
FIG. 9 is a diagram illustrating different examples of operation waveforms when loading is performed from the non-volatile element in the first exemplary embodiment of the present invention.

Alternatively, the load operation may be performed in one cycle, as shown in FIG. 9. FIG. 9 is different from FIG. 7 in that while two cycles were needed for the load operation in FIG. 7, one cycle is needed for the load operation in FIG. 9.

Operations from times T1 to T7 in FIG. 9 are the same as those in FIG. 7. FIG. 9 is different from FIG. 7 in that a load operation from the register having the address A2 is performed in the cycle after a time T11.

In the case where the semiconductor integrated circuit is synchronized with the clock CLK_SYS, the value of the register can be updated immediately after the time T11. However, the register from which a load operation is performed has a delay, so that the value of the register from which the load operation is performed is updated at the time T7 after the load operation. In the case where this delay is allowable in the semiconductor integrated circuit, loading may be instructed to be performed in one cycle, as shown in FIG. 9. Specifically, in the case where it is possible to secure a sufficient setup margin in the register arranged in a stage succeeding to the register from which loading has been performed, the operation as shown in FIG. 9 is possible.

Figure 10:
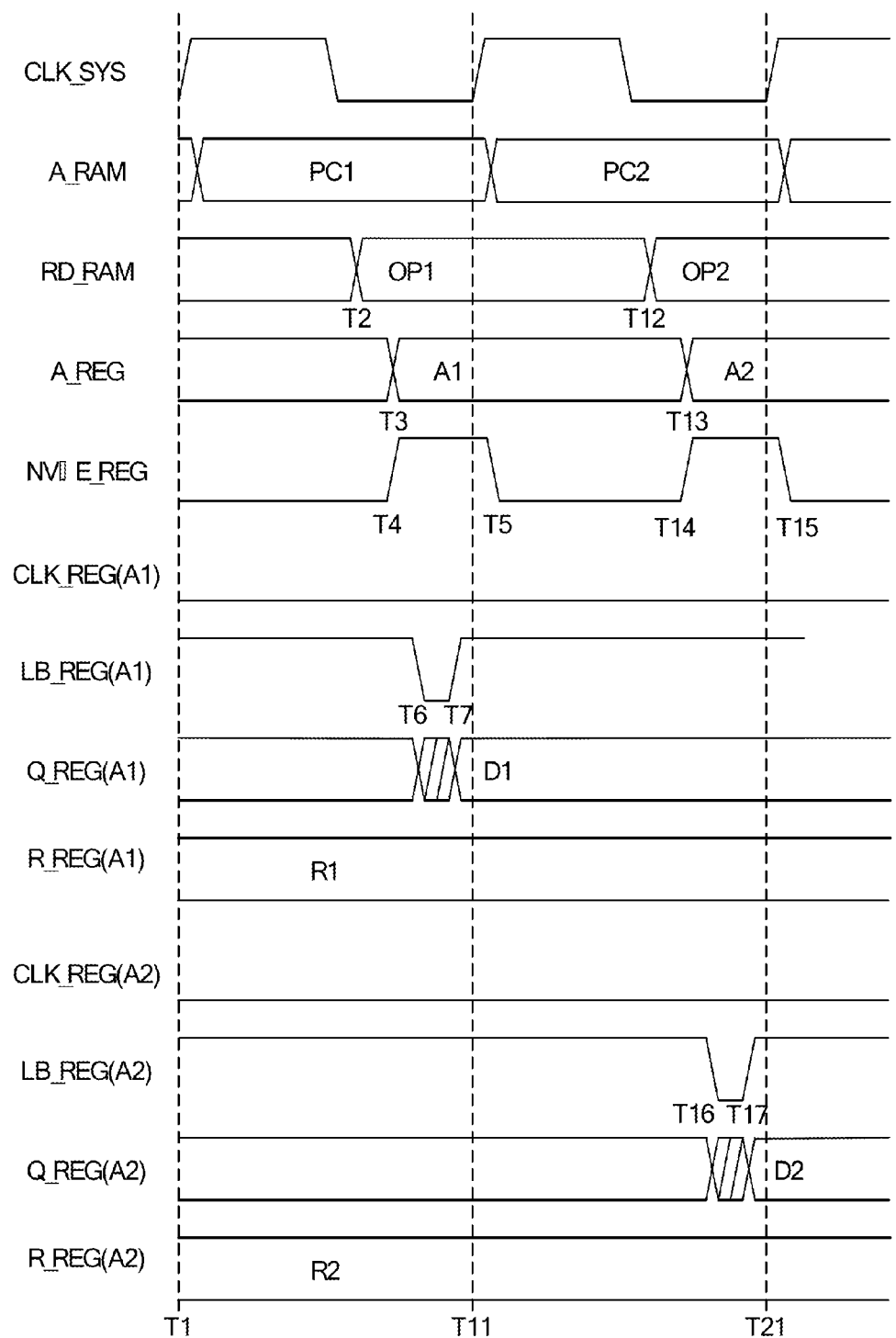
FIG. 10 is a diagram illustrating different examples of operation waveforms when loading is performed from the non-volatile element in the first exemplary embodiment of the present invention.

The load operation may be completed before a time T11 of a subsequent cycle, as shown in FIG. 10.

Operations from times T1 to T5 in FIG. 10 are the same as those in FIG. 7. FIG. 10 is different from FIG. 7 in that the non-volatile register control circuit 102 sets the load signal LB_REG (A1) for the register with the selected address A1 to a Low level to load data from the non-volatile element to the holding circuit in the non-volatile register 103.

At the time T7, the output data Q_REG (A1) of the non-volatile register having the address A1 is switched to data D1 (data read from the non-volatile element to the holding circuit) corresponding to the resistance value R1 of the non-volatile element resistance value R_REG (A1).

As described above, by combining the logic element and the non-volatile memory element in the semiconductor device (semiconductor integrated circuit) in this exemplary embodiment, a data transfer delay, and a power dissipation in an interconnect and a circuit used for the data transfer can be reduced when data is saved before power-off.

In the semiconductor integrated circuit in the related art, writing and loading in non-volatile registers are performed for each module. Thus, power dissipation for unnecessary writing and for unnecessary loading occurs. On contrast therewith, according to this exemplary embodiment, control can be performed for each non-volatile register. Thus, power dissipation for unnecessary data saving and for unnecessary data restoration can be reduced. This effect is achieved by allocating an address for each non-volatile register and providing instruction bits that specify the address and write and load instructions for the non-volatile register. Further, by performing writing to and loading from a group to which the specified non-volatile register belongs, temporal overhead needed for saving and restoring data can be reduced.

SECOND EXEMPLARY EMBODIMENT

Figure 11:
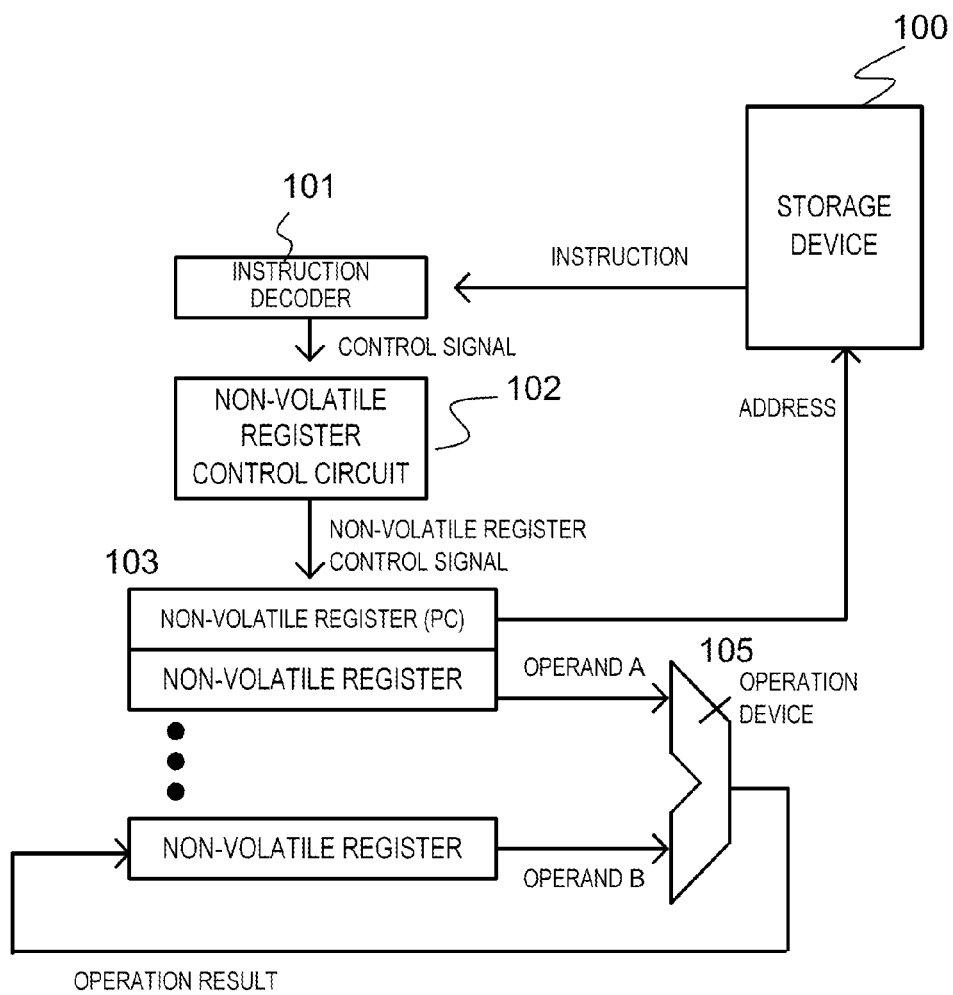
FIG. 11 is a diagram illustrating a configuration of a second exemplary embodiment of the present invention.

FIG. 11 is a diagram illustrating a configuration of a second exemplary embodiment of the present invention. In this exemplary embodiment, an operation equipment 105 is added to the first exemplary embodiment described with reference to FIG. 1.

The operation equipment 105 receives operands A and B of an instruction, executes an operation (such as a binary operation with respect to the operands A and B) specified by an op code, and then outputs a result of the operation.

FIG. 11 illustrates a case where values of registers are used as the operands A and B and the result of the operation is written back to the register. Memory data or the value of a register in a module can also be used as the operand. The operation equipment 105 may perform a unary operation as well as the binary operation.

Figure 12:
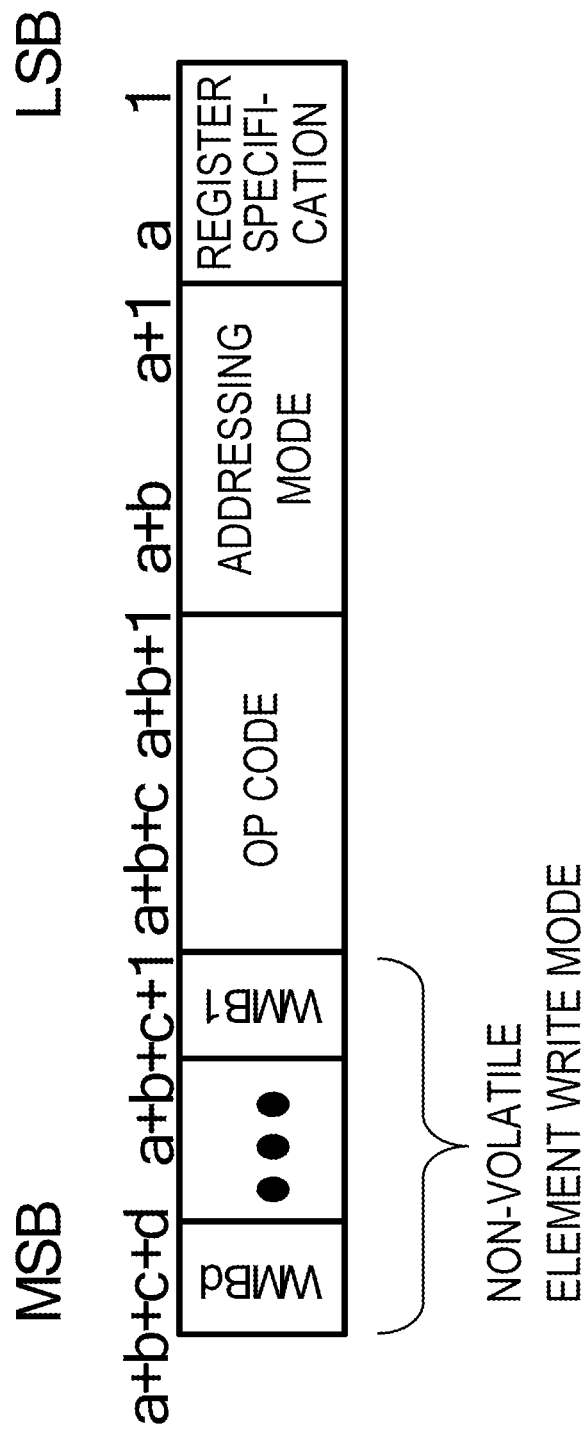
FIG. 12 is a diagram illustrating an example of an instruction format in the second exemplary embodiment of the present invention.

FIG. 12 is a diagram illustrating an instruction format. As shown in FIG. 12, one or more bits (bit field) capable of setting one or more non-volatile element write modes are included in the instruction in the second exemplary embodiment.

Out of the instruction constituted from (a+b+c) bits, a bits from first to a-th bit are used for specifying each register.

Then, b bits from (a+1)th bit to (a+b)th bit are used for specifying an addressing mode.

Then, c bits from (a+b+1)th bit to (a+b+c)th bit are used for specifying the op code.

Further, d bits from (a+b+c+1)th bit to (a+b+c+d)th bit are non-volatile element write mode bits WMB1 to WMBd, and are used for specifying the one or more non-volatile element write mode.

Each bit of the non-volatile element write mode bits WMb1 to WMBd is associated with a plurality of the non-volatile registers.

Specifically, m non-volatile registers $103_1$-$103_m$ having addresses A1 to Am are divided into q groups constituted from groups G1 to Gq.

Each group Gy ($1 \leq y \leq q$) is set to be associated with one WMBz ($1 \leq z \leq d$) of the non-volatile element write mode bits WMB1 to WMBd in a one-to-one correspondence. Alternatively, no non-volatile element write mode bit associated with the group Gy is set to be present for the group Gy.

Assume that writing is performed to the holding circuit in the non-volatile register having an address Ax belonging to the group Gy ($1 \leq y \leq q$). Then, when the associated non-volatile element write mode bit WMBz ($1 \leq z \leq d$) is "1", write data for the holding circuit is also written to the non-volatile element of the non-volatile register having the specified address Ax.

When the associated non-volatile element write mode bit WMBz is "0", the write data for the holding circuit is not written to the non-volatile element of the non-volatile register having the specified address Ax.

When the associated non-volatile write mode bit WMBz is not present, the write data for the holding circuit is not written to the non-volatile element of the non-volatile register having the specified address Ax (which is the same as in the case where the non-volatile element write mode bit WMBz is "0").

In the second exemplary embodiment, the non-volatile register control circuit 102 determines whether or not data is to be written back to the non-volatile register, and also determines whether not the data is to be written to the non-volatile element, based on the write mode bit.

The following description will be given, assuming that d is set to 1 bit and the number of the groups of the non-volatile registers q is set to 1 and that the non-volatile element write mode bit WMB1 is associated with the group G1, for simplicity. The following describes briefly the process from reading of the instruction to control over the non-volatile register.

First, a central processing unit outputs the address specified by a program counter PC, and then reads the instruction stored at that address from a storage equipment 100.

An instruction decoder 101 decodes the instruction read from the storage equipment 100.

When the non-volatile element write mode bit WMB1 of the op code is 1, the non-volatile register control circuit 102 writes back an operation result to the holding circuit of a specified non-volatile register 103, and also writes the operation result to the non-volatile element. Assume, for example, that a result of addition between non-volatile registers 103 having the addresses (register numbers) of 4 and 5 is written back to the non-volatile register 103 having the register number of 5 and the data is also written to the non-volatile element having the address (register number) of 5. Then, it should be so arranged that the bits for specifying the register are set to indicate the addresses (register numbers) of 4 and 5, that the addressing mode is set to a double-operand mode in which the operation is performed between the registers, that the op code is set to an addition instruction, and the non-volatile element write mode of the non-volatile register is set.

Figure 13:
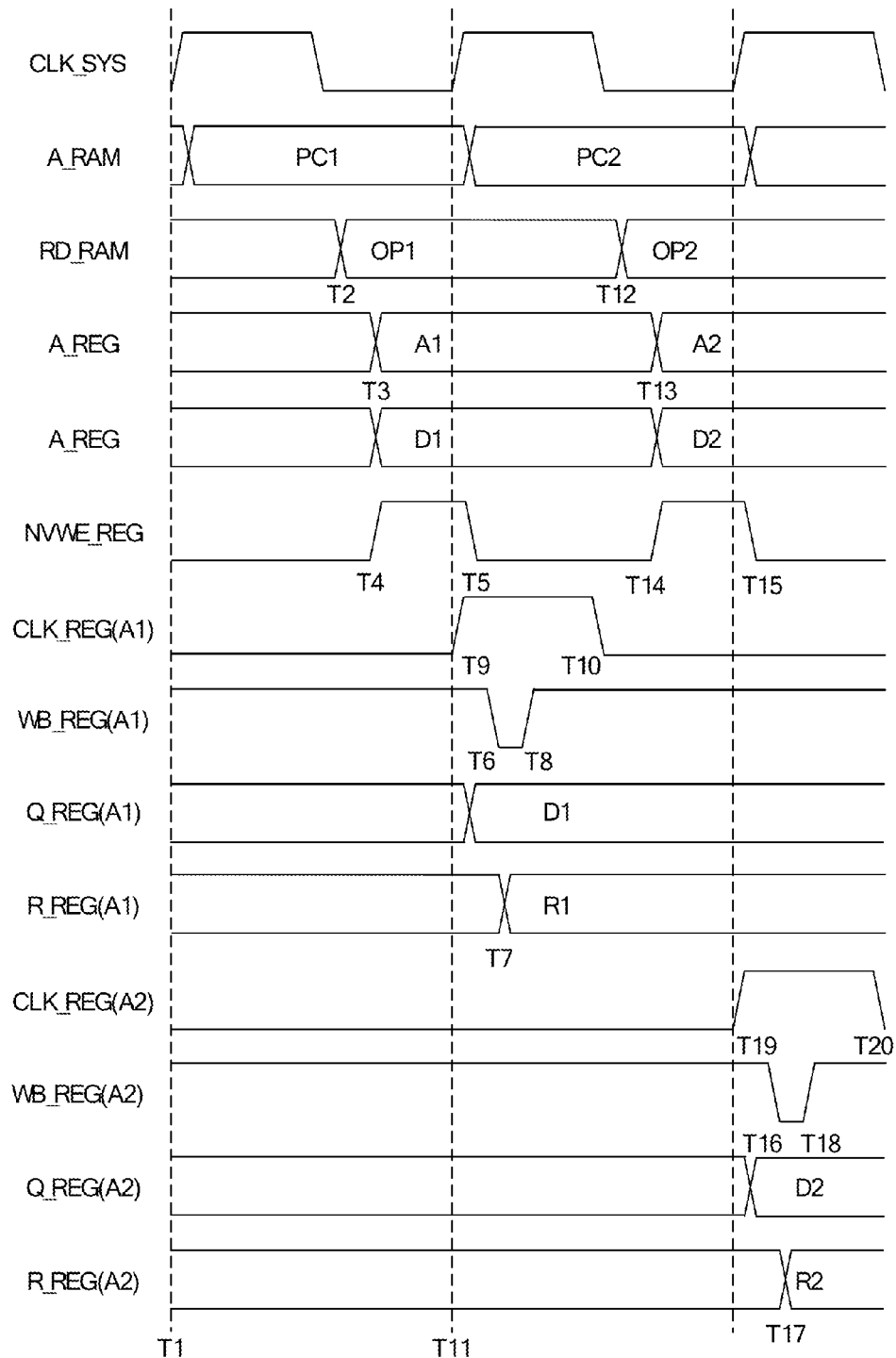
FIG. 13 is a diagram illustrating examples of operation waveforms when writing is performed to a non-volatile element in the second exemplary embodiment of the present invention.

FIG. 13 is a diagram illustrating examples of operation waveforms in the non-volatile element write mode in the second exemplary embodiment of the present invention. The following describes an operation when writing is performed to the non-volatile register and is also performed to the non-volatile element, with reference to FIGS. 13 and 11.

Immediately after a time T1, the central processing unit (program counter) outputs to the storage equipment 100 a program counter value PC1 as an address A_RAM.

At a time T2, the instruction decoder 101 receives an instruction OP1 as data RD_RAM read from the address A_RAM of the storage equipment 100. Herein, the instruction OP1 has the instruction format as shown in FIG. 12. The non-volatile element write mode bit is set to 1.

The op code specifies an operation. The operation is performed between the registers having addresses Ax and A1, and a result of the operation is written back to the non-volatile register having the address A1.

At a time T3, the instruction decoder 101 interprets the instruction OP1 to output the address A1 as an address A_REG of the register.

Further, at the time T3, the operation equipment 105 outputs an operation result D1 as input data D_REG to the non-volatile register.

At a time T4, the instruction decoder 101 interprets the instruction OP1 to output to the non-volatile register control circuit 102 a write enable signal NVWE_REG for the non-volatile element, and then finishes the output at a time T5.

At a time T9, the non-volatile register control circuit 102 sets a write signal WB_REG (A1) for writing volatile data to non-volatile register 103 of the address A1 to a High level to write the data D1 to the non-volatile element of the non-volatile register having the address A1.

During a period from a time T6 to a time T8, the non-volatile register control circuit 102 sets a control signal WB_REG (A1) for writing to the non-volatile register 103 having the selected address A1 to a Low level to perform the write operation to the non-volatile element of the non-volatile register.

At the time 7, a non-volatile element resistance value R_REG (A1) of the non-volatile register having the address A1 is switched to a resistance value R1 corresponding to the operation result D1.

In the subsequent clock cycle, there are illustrated operation waveforms when writing to the non-volatile element in the non-volatile register having an address A2 is performed. The writing is performed by a sequence of processes similar to those in the case of the address A1.

As described above, a similar effect to that according to the first exemplary embodiment can be obtained in the second exemplary embodiment.

Further, compared with the first exemplary embodiment, writing of volatile data in the non-volatile register simultaneously with writing to the non-volatile element can be performed. Accordingly, writing of volatile data to the holding circuit and writing to the non-volatile element in the non-volatile register can be performed in one instruction cycle in the second exemplary embodiment, while two instructions, that is, one instruction for writing of non-volatile data to the holding circuit and another instruction for writing data held in the holding circuit to the non-volatile element, are needed in the first exemplary embodiment. Thus, an execution time can be reduced, and a program region can also be reduced.

Further, consistency between volatile data and non-volatile data can constantly be maintained, in preparation for an unexpected power supply stop. Thus, a semiconductor integrated circuit that has a high tolerance against a power supply failure can be provided.

THIRD EXEMPLARY EMBODIMENT

Figure 14:
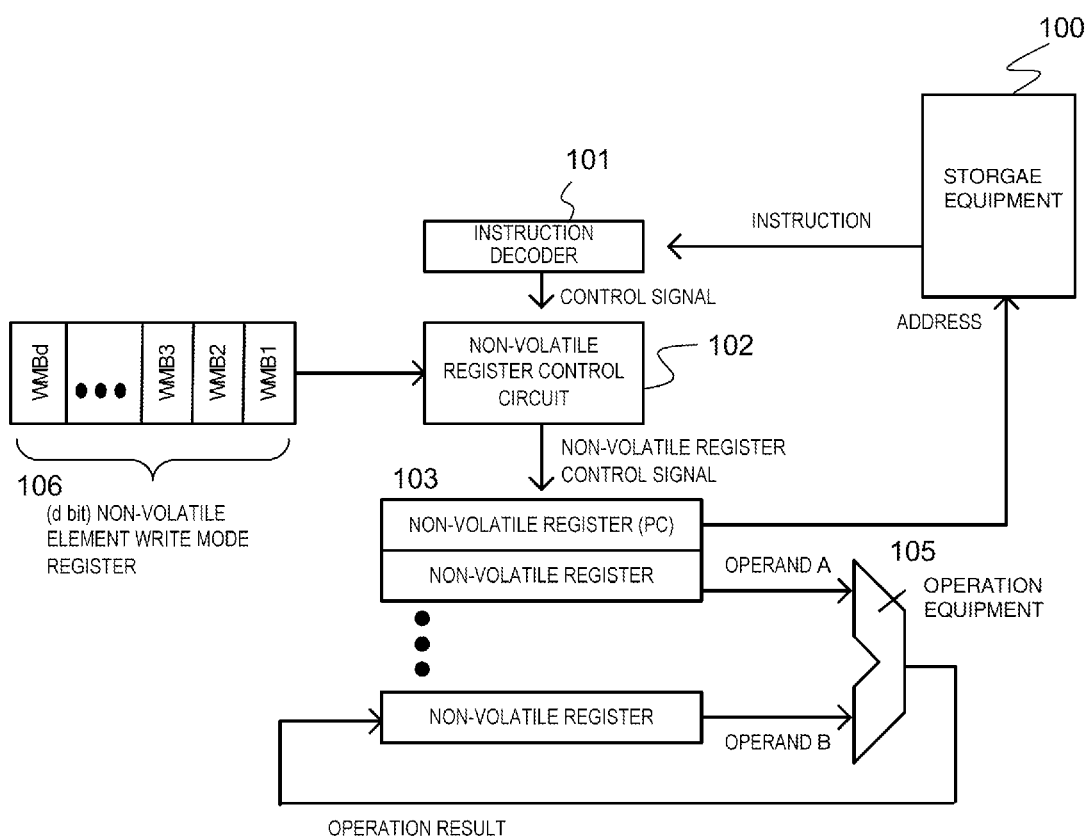
FIG. 14 is a diagram illustrating a configuration of a third exemplary embodiment of the present invention.

FIG. 14 is a diagram illustrating a configuration of a third exemplary embodiment of the present invention. In a semiconductor integrated circuit in this exemplary embodiment, a d-bit non-volatile element write mode register 106 is added to the second exemplary embodiment described with reference to FIG. 11.

Figure 15:
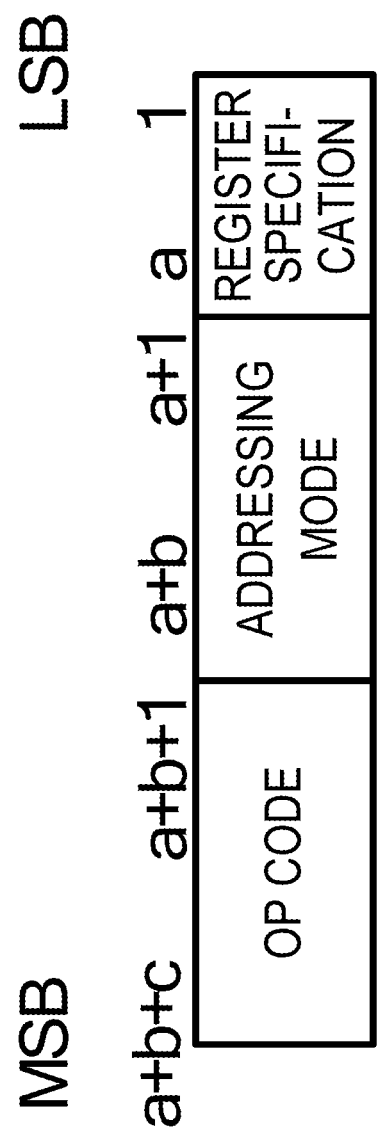
FIG. 15 is a diagram illustrating an example of an instruction format in the third exemplary embodiment of the present invention.

It is noted that the non-volatile write mode register 106 does not necessarily need to be a non-volatile register, and may be a register configured to hold only volatile data. FIG. 15 is a diagram illustrating the format of an instruction for the semiconductor integrated circuit including non-volatile registers according to the third exemplary embodiment of the present invention.

Compared with the second exemplary embodiment, there is no bit field for setting a non-volatile element write mode in an instruction in the third exemplary embodiment. In other words, though one or more bits for specifying one or more non-volatile element write modes are provided within an instruction in the second exemplary embodiment, such bits are provided as the register in the third exemplary embodiment.

Each bit of the write mode bits WMB1 to WMBd for the non-volatile registers is associated with a plurality of the non-volatile registers. Specifically, as in the second exemplary embodiment, addresses A1 to Am of m non-volatile registers $103_1$-$103_m$ are divided into q groups constituted from groups G1 to Gq. Each group Gy ($1 \leq y \leq q$) is set to be associated with one WMBz ($1 \leq z \leq d$) out of the write mode bits WMB1 to WMBd for non-volatile elements in a one-to-one correspondence. Alternatively, no non-volatile element write mode bit associated with the group Gy is set to be present for the group Gy.

Assume that writing is performed to the holding circuit in the non-volatile register having an address Ax belonging to the group Gy ($1 \leq y \leq q$). Then, when the associated non-volatile element write mode bit WMBz ($1 \leq z \leq d$) is "1", write data for the holding circuit is also written to the non-volatile element of the non-volatile register having the specified address Ax.

When the associated non-volatile element write mode bit WMBz is "0", the write data for the holding circuit is not written to the non-volatile element of the non-volatile register having the specified address Ax.

When the associated non-volatile write mode bit WMBz is not present, the write data for the holding circuit is not written to the non-volatile element of the non-volatile register having the specified address Ax.

As described above, in the third exemplary embodiment, a non-volatile register control circuit 102 determines whether or not data is to be written back to a non-volatile register 103 and also determines whether not data is to be written to the non-volatile element of the non-volatile register 103 as well, based on set information (non-volatile element write mode bit information) held in the write mode register 106.

It is assumed that d is set to 1 bit and the number of the groups of the non-volatile registers q is set to 1 and that the non-volatile element write mode bit WMB1 is associated with the group G1, for simplicity. The following describes briefly the process from setting of the non-volatile element write mode register to control of the non-volatile register.

First, a central processing unit outputs the address specified by a program counter PC, and then reads the instruction stored at that address from a storage equipment 100.

An instruction decoder 101 decodes the instruction read from the storage equipment 100.

When the op code is an instruction to set the bit WMB1 of the non-volatile write mode register to "1", the value of the non-volatile element write mode bit register is set to "1", and the information on the register is supplied to the non-volatile register control circuit 102.

Then, in the case where the instruction read in a certain clock cycle is an instruction of writing an operation result to the holding circuit in the non-volatile register 103, the non-volatile register control circuit 102 refers to the value of the non-volatile element write mode register 106. When the associated bit value of the non-volatile element write mode register 106 can be confirmed to be "1", volatile data is written to the holding circuit in the non-volatile register having the address selected, and data held in the non-volatile element in the non-volatile register is rewritten. In this case, detailed waveforms when the writing is performed are the same as those in FIG. 13. Thus, description of an operation of the semiconductor integrated circuit when the writing is performed will be omitted.

As described above, according to the third exemplary embodiment, a similar effect to that in the first exemplary embodiment can be obtained.

Further, the third exemplary embodiment has a higher compatibility with the existent architecture than the second exemplary embodiment. That is, though the one or more bits for specifying the one or more non-volatile register write modes need to be added in the second exemplary embodiment, there may be a case where no empty bit is present in the existing op code. In this case, it is necessary to widen the bit width of the instruction or to divide the instruction into two instructions. It is therefore necessary to greatly modify the existing architecture.

On contrast therewith, according to the third exemplary embodiment, by providing the non-volatile element write mode register 106, there is no need to change the op code, and hence there is an advantage that the existent architecture can be used without alteration.

FOURTH EXEMPLARY EMBODIMENT

Figure 16:
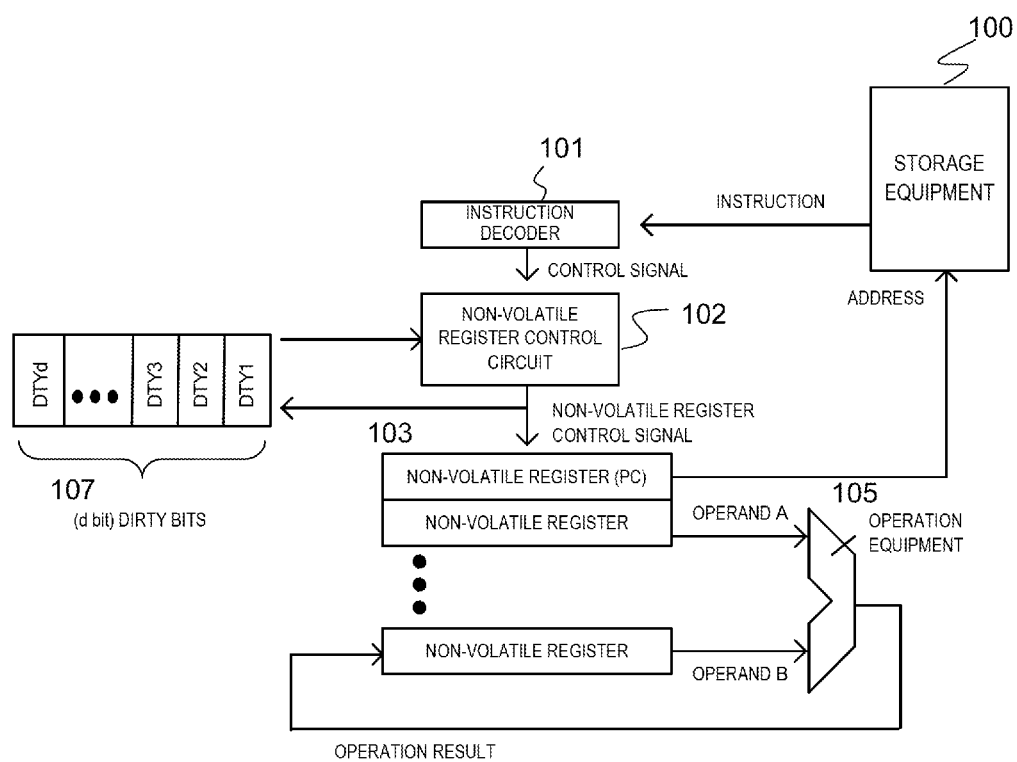
FIG. 16 is a diagram illustrating a configuration of a fourth exemplary embodiment of the present invention.

FIG. 16 is a diagram illustrating a configuration of a fourth exemplary embodiment of the present invention. Referring to FIG. 16, in the fourth exemplary embodiment, an operation equipment 105 and dirty bits 107 are added to the first exemplary embodiment. It is noted that the dirty bits do not necessarily need to be provided as a non-volatile register, and may be a conventional register configured to hold only volatile data.

Referring to FIG. 16, dirty bits DTY1 to DTYd constituted by d bits are provided in a register 107, and addresses A1 to Am of m non-volatile registers are divided into s groups G1 to Gs. Each group Gy ($1 \leq y \leq s$) is set to be associated with one DTYz of the dirty bits DTY1 to DTYd in a one-to-one correspondence. Alternatively, no non-volatile element write mode bit associated with the group Gy is set to be present for the group Gy.

In case where data in each holding circuit of all of the non-volatile registers belonging to the group Gy ($1 \leq y \leq s$)

matches data held in each non-volatile element of all of the non-volatile registers belonging to the group Gy, when the dirty bit DTYz ($1 \leq z \leq d$) associated with the group Gy is present, the dirty bit DTYz is set to "0".

In case where there is a possibility that data held in a holding circuit(s) in the non-volatile registers belonging to the group Gy may not match data held in the corresponding non-volatile element (s) in the non-volatile registers belonging to the group Gy, when the dirty bit DTYz is present, the dirty bit DTYz is set to "1".

Assuming that an instruction decoded by an instruction decoder 101 is a write instruction for the non-volatile element of the non-volatile register having an address Ax, and that the dirty bit DTYz associated with the group Gy to which the non-volatile register having the address Ax belongs is present, when the dirty bit DTYz is "1", data in the holding circuit is written to the non-volatile element in the non-volatile register having the address Ax, while when the dirty bit DTYz is "0", the data held in the holding circuit is not written to the non-volatile element in the non-volatile register having the address Ax.

Figure 17:
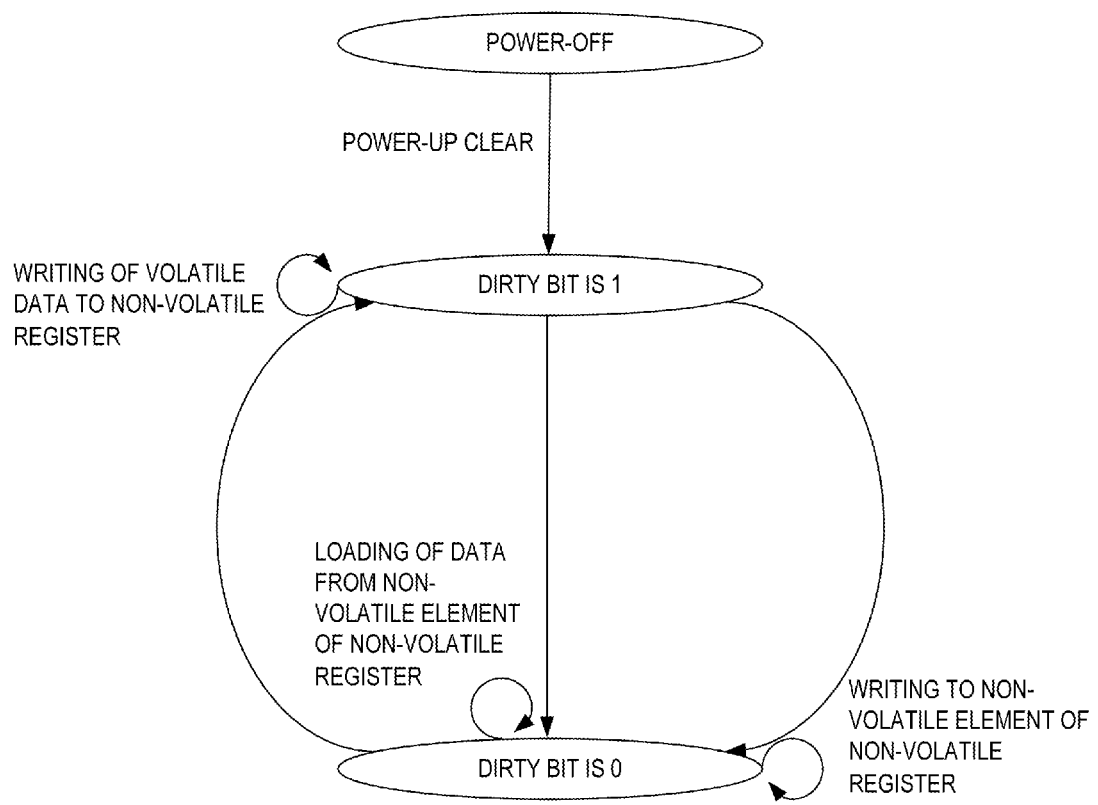
FIG. 17 is a diagram illustrating a state transition of a dirty bit in the fourth exemplary embodiment of the present invention.

FIG. 17 is a diagram illustrating a state transition of the dirty bit in the fourth exemplary embodiment of the present invention. A non-volatile register control circuit 102 causes data to be written so as to implement the following state transition of the dirty bit. The value of each dirty bit is stored in an existing volatile flip-flop (normal flip-flop), for example, and writing is performed in a similar manner to that in the case of the normal flip-flop.

A preset initial value is set in the holding circuit in the non-volatile register having the address Ax belonging to the group Gy when power is on.

When the dirty bit DTYz associated with the group Gy is present, the dirty bit DTYz is set to "1".

When volatile data is written to the holding circuit in the non-volatile register having the address Ax, and when the dirty bit DTYz is present, the dirty bit DTYz is set to "1".

When the data held in the non-volatile element is loaded to the holding circuit of each non-volatile register belonging to the group Gy, and when the dirty bit DTYz is present, the dirty bit DTYz is set to "0".

When the data held in the holding circuit is written to the non-volatile element of each non-volatile register belonging to the group Gy, and when the dirty bit DTYz is present, the dirty bit DTYz is set to "0".

The following describes use of the value of the dirty bit in detail. As described above, the non-volatile register control circuit 102 needs to refer to the value of the dirty bit when writing to the non-volatile element is performed. The non-volatile register control circuit 102 can select the desired value of the dirty bit out of outputs of the dirty bits.

When writing is performed to the non-volatile element of the non-volatile register having the address Ax, for example, the non-volatile register control circuit 102 selects the value of the dirty bit DTYz for the group Gy to which the address Ax belongs from among the plurality of outputs of the dirty bits, using a circuit such as a multiplexer (not shown), based on information on the address Ax supplied from the instruction decoder 101.

Then, the non-volatile register control circuit 102 determines whether or not to perform writing to the non-volatile element, according to the value of the dirty bit DTYz.

The dirty bit is useful for reducing power dissipation in writing to the non-volatile element.

In the first exemplary embodiment, data saving can be attentively performed before a power-off. There is a case, however, where it is difficult to manage which data has been already saved and which data has not been saved yet. If that problem is to be solved by saving all data in that case, power dissipation needed for writing increases.

On contrast therewith, in the fourth exemplary embodiment, the dirty bit is used before a power-off, and data is written to the non-volatile element of the non-volatile register with the dirty bit of "1" alone. Consequently, the need for writing the data to the non-volatile elements of all the registers before the power off is eliminated. The number of the non-volatile elements to which the writing is to be performed can be therefore reduced.

The second and third exemplary embodiments make it possible to constantly save data to the non-volatile elements. Thus, it is not necessary to manage which data is saved.

However, in such a case where writing is performed to the same address a plurality of times, writing to the non-volatile element, each time the writing is performed, leads to wasteful power dissipation.

In the fourth exemplary embodiment, data held in the non-volatile element is not rewritten, each time writing to the volatile register (holding circuit) in the non-volatile register is performed, as described above. Thus, even if writing to the register with the same address occurs a plurality of times, the number of wasteful writing to the non-volatile element can be reduced.

In the fourth exemplary embodiment, a restoration point can be generated, in preparation for an unexpected power supply shutdown, with lower power dissipation. This effect is achieved because writing to the non-volatile element in the non-volatile register with the dirty bit of 1 alone should be performed, as described above.

As described above, according to the fourth exemplary embodiment, a similar effect to that in the first exemplary embodiment can be obtained. Further, by providing the dirty bits, the number of the non-volatile elements to which writing is to be performed and the number of times of writing can be reduced. A delay and power dissipation for data saving can be readily reduced.

The above specific description was given about some exemplary embodiments of the present invention. The present invention, is not, however, limited to the above-mentioned exemplary embodiments. Various modifications can be made without departing from the gist of the present invention, and these variation examples are also included in the present invention. To take an example, the above description was given, centering on the registers within the central processing unit. The present invention can also be readily extended to a register in a peripheral module. The register in the peripheral module is included in the present invention. A similar effect can be obtained from an exemplary embodiment obtained by combining the respective exemplary embodiments. The exemplary embodiment obtained by combining the respective exemplary embodiments is also included in the present invention. Each disclosure of the above-listed Patent Literatures is incorporated herein by reference. Modification and adjustment of each exemplary embodiment and each example are possible within the scope of the overall disclosure (including the claims) of the present invention and based on the technical concept of the present invention. Various combinations and selections of various disclosed elements (including each element in each claim, each element in each exemplary embodiment and each example, and each element in each drawing) are possible within the scope of the claims of the present invention. That is, the present invention naturally includes various variations and modifications that could be made by those skilled in the art according to the overall disclosure including the claims and the technical concept.

The invention claimed is:

1. A semiconductor device comprising:
an instruction decoder configured to decode an instruction read from a storage equipment;
one or a plurality of non-volatile registers, each non-volatile register having an address allocated, said each non-volatile register including at least one flip-flop, said flip-flop including:
a holding circuit configured to hold data in a volatile manner; and
a non-volatile element configured to hold data in a non-volatile manner; and
a non-volatile register control circuit configured to control said one or plurality of non-volatile registers,
wherein an instruction set decodable by said instruction decoder comprises at least:
a write instruction including information specifying an address of said non-volatile register and information specifying writing of data from said holding circuit to said non-volatile element in said non-volatile register; and
a load instruction including information specifying an address of said non-volatile register and information specifying loading from said non-volatile element to said holding circuit in said non-volatile register,
said non-volatile register control circuit performing control such that, when an instruction decoded by said instruction decoder is said write instruction, data held in said holding circuit is transferred and written to said non-volatile element in said non-volatile register having an address specified by said write instruction, while, when said instruction decoded by said instruction decoder is said load instruction, data held in said non-volatile element is transferred to and held in said holding circuit in said non-volatile register having an address specified by said load instruction.

2. The semiconductor device according to claim 1, wherein said non-volatile register comprises a plurality of non-volatile registers,
non-volatile element write mode bit information specifying writing from said holding circuit to said non-volatile element in said non-volatile register being included in a predetermined bit field of said instruction, or said non-volatile element write mode bit information being held in a register provided in said semiconductor device,
addresses of said plurality of non-volatile registers being divided into a plurality of groups, each group being associated with one of said non-volatile element write mode bit information in a one-to-one correspondence, or there being the group not provided with said non-volatile element write mode bit information associated therewith,
when data is written to said holding circuit in said non-volatile register having an address belonging to one of said groups, said non-volatile register control circuit performs control such that,
when a value of said non-volatile element write mode bit information associated with said group is active,
write data to said holding circuit in said non-volatile register having said specified address is written to said non-volatile element in said non-volatile register having said specified address, and
when a value of said non-volatile element write mode bit information associated with said group is inactive,
write data to said holding circuit in said non-volatile register having said specified address is not written to said non-volatile element in said non-volatile register having said specified address; and
when said non-volatile element write mode bit information associated with said group is not present, said write data to said holding circuit in said non-volatile register having said specified address is not written to said non-volatile element in said non-volatile register having said specified address.

3. The semiconductor device according to claim 1, including:
a register configured to hold flag bits, each flag bit indicating that contents of said holding circuit and said non-volatile element in said non-volatile register are different, wherein
addresses of a plurality of said non-volatile registers are divided into a plurality of groups, each group being associated with one of said flag bits in a one-to-one correspondence, or there being the group not provided with said flag bit associated therewith,
when data in said holding circuit matches data held in said non-volatile element in each of all said non-volatile registers belonging to one group, and when said flag bit associated with said one group is present, said flag bit is set to a first value,
when said data held in said holding circuit and data held in said non-volatile element in at least one of said non-volatile registers belonging to said one group may not match, and when said flag bit associated with said one group is present, said flag bit is set to a second value, and
when said instruction decoded by said instruction decoder is said write instruction for said non-volatile element in said non-volatile register having an address specified by said instruction, said non-volatile register control circuit performs control such that,
when said flag bit associated with said group to which said non-volatile register having said address belongs is present, and when said flag bit has said second value, said data held in said holding circuit is written to said non-volatile element in said non-volatile register having said address, and
when said flag bit has said first value, said data held in said holding circuit is not written to said non-volatile element in said non-volatile register having said address.

4. The semiconductor device according to claim 3, wherein, when power is on, an preset initial value is set in said holding circuit in said non-volatile register having said address to which said group belongs;
said flag bit is set to said second value when said flag bit associated with said group is present;
said non-volatile register control circuit performs control such that, when non-volatile data is written to said holding circuit in said non-volatile register having said address, and when said flag bit associated with said group is present, said flag bit is set to said second value,
when data held in said non-volatile element is loaded to said holding circuit of each of said non-volatile registers belonging to said group, and when said flag bit associated with said group is present, said flag bit associated with said group is set to said first value,
when data held in said holding circuit is written to said non-volatile element of each of said non-volatile registers belonging to said group, and when said flag bit associated with said group is present, said flag bit associated with said group is set to said first value;

when said instruction decoded by said instruction decoder is said write instruction for said non-volatile element in said non-volatile register having said address specified by said instruction, and when said flag bit associated with said group to which said non-volatile register having said address belongs is present, data held in said holding circuit in said non-volatile register is written to said non-volatile element in said non-volatile register having said address, when said flag bit has said second value, and data held in said holding circuit in said non-volatile register is not written to said non-volatile element in said non-volatile register having said address, when said flag bit has said first value.

5. The semiconductor device according to claim 1, wherein addresses of said plurality of non-volatile registers are divided into a plurality of groups, said instruction specifying one address belonging to one of said groups, said non-volatile register control circuit performs control such that, when said instruction decoded by said instruction decoder is said write instruction for said non-volatile element in said non-volatile register, data held in said holding circuit is written to said non-volatile element in each of all of said non-volatile registers belonging to said group, when said instruction decoded by said instruction decoder is said load instruction from said non-volatile element to said holding circuit in said non-volatile register, data held in said non-volatile element is loaded to said holding circuit in each of all of said non-volatile registers belonging to said group.

6. The semiconductor device according to claim 1, wherein said semiconductor device performs a pipeline operation of:

reading said write instruction from said storage equipment in a first cycle; and performing said writing to said non-volatile element in said non-volatile register having said address specified by said write instruction in a second cycle subsequent to said first cycle and also reading a next instruction from said storage equipment in said second cycle.

7. The semiconductor device according to claim 1, wherein said flip-flop includes, as said holding circuit:

a first inverting circuit having an input thereof and an output thereof respectively connected to a first node and a second node; and a second inverting circuit having an output thereof and an input thereof respectively connected to said first node and said second node;

said first inverting circuit disposed between a first power supply and a third node, said second inverting circuit disposed between said first power supply and a fourth node, said flip-flop further including a circuit configured to equalize said first and second nodes to a power supply voltage of said first power supply when an input load signal is in active state;

said flip-flop includes, as said non-volatile element:

first and second magnetic resistance elements having first terminals respectively connected to said third and fourth nodes, having second terminals respectively connected to fifth and sixth nodes, and having third terminals connected to each other, said fifth and sixth nodes being connected to a second power supply through a first switch configured to be turned on and off by a write control signal, said first switch being turned off according to said write control signal when signals at said first and second nodes in said holding circuit are written to said non-volatile element;

said flip-flop includes:

a write circuit configured to make a current flow through said first and second magnetic resistance elements in a first direction with said second terminal of said second magnetic resistance element set to a potential of said first power supply and with said second terminal of said first magnetic resistance element set to a potential of said second power supply when said first node and said second node respectively have said first and second values; and configured to make a current flow through said first and second magnetic resistance elements in a second direction opposite to said first direction with said second terminal of said first magnetic resistance element set to said potential of said first power supply and with said second terminal of said second magnetic resistance element set to said potential of said second power supply when said first node and said second node respectively have said second and first values; and said first node and said second node are shut off from input data due to second and third switches configured to be turned off when said data held in said holding circuit is written to said non-volatile element, and when said data held in said non-volatile element is transferred to said holding circuit for loading.

8. The semiconductor device according to claim 1, wherein said holding circuit in said flip-flop includes a latch including master and slave latches configured to hold said data, said non-volatile element includes a magnetic resistance element; and said semiconductor device includes one of functions of:

writing data held in said slave latch to said non-volatile element and loading data from said non-volatile element to said slave latch;

writing data held in said master latch to said non-volatile element and loading data from said non-volatile element to said master latch;

writing data held in said slave latch to said non-volatile element and loading said data from said non-volatile element to said master latch; and writing data held in said master latch to said non-volatile element and loading data from said non-volatile element to said master latch.

9. A control method of a semiconductor device comprising one or a plurality of non-volatile registers each including at least one flip-flop including a holding circuit configured to hold data in a volatile manner and a non-volatile element configured to hold said data in a non-volatile manner, an address being given to each non-volatile register, said method comprising:

provided as an instruction set decodable by an instruction decoder, at least:

a write instruction including information specifying an address of said non-volatile register and information specifying writing data from said holding circuit to said non-volatile element in said non-volatile register; and a load instruction including information specifying said address of said non-volatile register and information specifying loading from said non-volatile element to said holding circuit in said non-volatile register, when an instruction decoded by said instruction decoder is said write instruction, transferring said data held in said holding circuit to be written to said non-volatile element in said non-volatile register having an address specified by said write instruction, and when said instruction decoded by said instruction decoder is said load instruction, transferring said data held in said non-volatile element to be held in said holding circuit in said non-volatile register having said address specified by said load instruction.

10. The control method of a semiconductor device according to claim 9, comprising:

holding non-volatile element write mode bit information specifying writing from said holding circuit to said non-volatile element in said non-volatile registers in a predetermined bit field of said instruction, or holding said non-volatile element write mode bit information in a register;

dividing addresses of said plurality of non-volatile registers into a plurality of groups, each group being associated with one of said non-volatile element write mode bit information in a one-to-one correspondence, or there being the group not provided with said non-volatile element write mode bit information associated therewith;

when data is written to said holding circuit in said non-volatile register having an address belonging to one of said groups, said non-volatile register control circuit performing control such that, when a value of said non-volatile element write mode bit information associated with said group is active, write data to said holding circuit in said non-volatile register having said specified address is written to said non-volatile element in said non-volatile register having said specified address, and when a value of said non-volatile element write mode bit information associated with said group is inactive, write data to said holding circuit in said non-volatile register having said specified address is not written to said non-volatile element in said non-volatile register having said specified address; and when said non-volatile element write mode bit information associated with said group is not present, said write data to said holding circuit in said non-volatile register having said specified address is not written to said non-volatile element in said non-volatile register having said specified address.

11. A processor apparatus comprising one or a plurality of non-volatile registers, each non-volatile register having an address allocated, said each non-volatile register including at least one flip-flop, said flip-flop including:

a holding circuit configured to hold data in a volatile manner; and a non-volatile element configured to hold data in a non-volatile manner; and a non-volatile register control circuit configured to control said one or plurality of non-volatile registers, an instruction set for said processor apparatus comprising at least:

a write instruction including information specifying an address of said non-volatile register and information specifying writing of data from said holding circuit to said non-volatile element in said non-volatile register; and a load instruction including information specifying an address of said non-volatile register and information specifying loading from said non-volatile element to said holding circuit in said non-volatile register, in response to said write instruction, said non-volatile register control circuit performing control such that data held in said holding circuit is transferred and written to said non-volatile element in said non-volatile register having an address specified by said write instruction, while, in response to said load instruction, said non-volatile register control circuit performing control such that data held in said non-volatile element is transferred to and held in said holding circuit in said non-volatile register having an address specified by said load instruction.

12. The processor apparatus according to claim 11, further comprising an operation circuit configured to receive data from one or plurality of said non-volatile registers, to operate the data received and to store an operation result to one of said non-volatile registers.

13. The processor apparatus according to claim 11, comprising non-volatile element write mode bit information specifying writing from said holding circuit to said non-volatile element in said non-volatile register, non-volatile element write mode bit information being included in a predetermined bit field of said write instruction, or said processor apparatus including a register configured to hold said non-volatile element write mode bit information.

14. The processor apparatus according to claim 11, comprising a register configured to hold one or more flag bits, each flag bit indicating that contents of said holding circuit and said non-volatile element in said non-volatile register are different.

15. The processor apparatus according to claim 11, wherein addresses of a plurality of said non-volatile registers are divided into a plurality of groups, said non-volatile register control circuit performing control of access to said non-volatile register on a per group basis.

* * * * *